United States Patent
Aisenbrey

(10) Patent No.: US 7,372,006 B2
(45) Date of Patent: May 13, 2008

(54) LOW COST HEATING DEVICES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc, Bellingham, WA (US)

( * ) Notice: Subject to any disclaimer, the term of this patent is extended or adjusted under 35 U.S.C. 154(b) by 161 days.

(21) Appl. No.: 10/819,808

(22) Filed: Apr. 7, 2004

(65) Prior Publication Data

US 2004/0188418 A1    Sep. 30, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,774, filed on Jun. 16, 2003, provisional application No. 60/461,877, filed on Apr. 10, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
    *H05B 3/58* (2006.01)
(52) U.S. Cl. ................................ 219/535; 219/544
(58) Field of Classification Search .............. None
    See application file for complete search history.

(56) References Cited

U.S. PATENT DOCUMENTS 4,074,222 A * 2/1978 Kiyokawa et al. .......... 338/212
4,197,218 A   4/1980 McKaveney ................ 252/503
4,329,726 A * 5/1982 Middleman et al. ......... 361/58
4,543,474 A * 9/1985 Horsma et al. ............. 219/553

(Continued)

FOREIGN PATENT DOCUMENTS

GB      2377449 A    1/2003

(Continued)

OTHER PUBLICATIONS

"I Want My Pizza Hot!", by Sloenaty, Jrnl. of Science, Tech., Engineering+Math Edu., Jan.-Apr. 2000, vol. 1, Issue 1, pp. 16-23.

(Continued)

*Primary Examiner*—Thor S. Campbell
(74) *Attorney, Agent, or Firm*—Douglas Schnabel

(57) ABSTRACT

Heating devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

47 Claims, 16 Drawing Sheets

U.S. PATENT DOCUMENTS

| | | | |
|---|---|---|---|
| 4,689,475 A * | 8/1987 | Kleiner et al. | 219/553 |
| 4,755,659 A * | 7/1988 | Leon et al. | 219/547 |
| 5,111,025 A * | 5/1992 | Barma et al. | 219/217 |
| 5,181,006 A * | 1/1993 | Shafe et al. | 338/22 R |
| 5,586,214 A * | 12/1996 | Eckman | 392/503 |
| 5,771,027 A | 6/1998 | Marks et al. | 343/912 |
| 5,925,275 A * | 7/1999 | Lawson et al. | 219/543 |
| 6,249,261 B1 | 6/2001 | Solberg, Jr. et al. | 343/801 |
| 6,277,303 B1 | 8/2001 | Foulger | 252/500 |
| 6,300,607 B1 * | 10/2001 | Steinhauser et al. | 219/544 |
| 6,368,704 B1 | 4/2002 | Murata et al. | 428/323 |
| 6,452,138 B1 * | 9/2002 | Kochman et al. | 219/549 |
| 6,483,087 B2 * | 11/2002 | Gardner et al. | 219/545 |
| 6,558,746 B2 | 5/2003 | Starz et al. | 427/387 |
| 6,602,446 B2 | 8/2003 | Ushijima | 252/512 |

OTHER PUBLICATIONS

"Nano composite Materials Offer Higher Conductivity and Flexibility," by McCluskey et al., Proc. of 3rd Int'l Conf. on Adhesive Joining+Coating Tech. in Elec. Manuf. 1998, pp. 282-286.

Nv Bekaert sa of Kortrijk, Belgium found www.bekaert.com, Jan. 25, 2003.

* cited by examiner

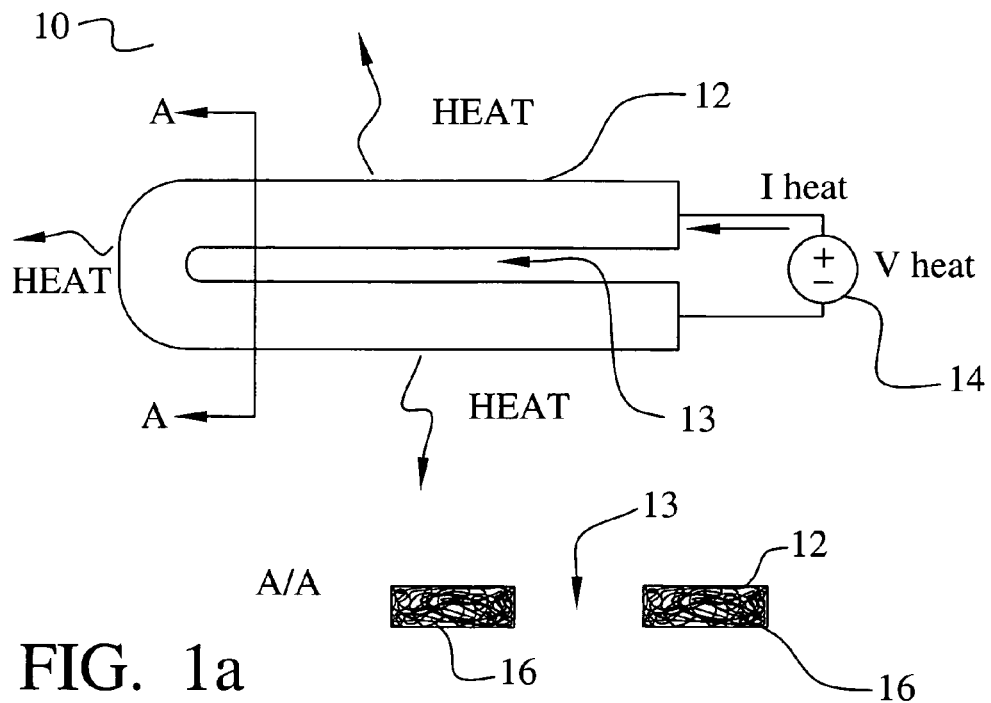
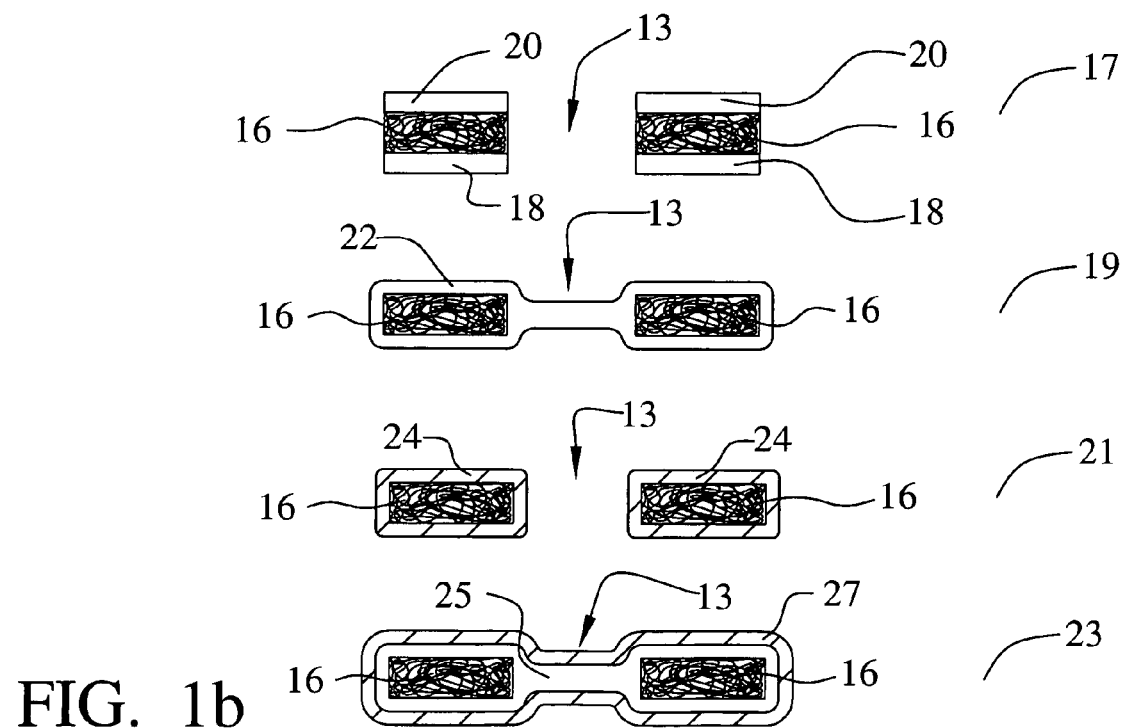
FIG. 1a
FIG. 1b

LOW COST HEATING DEVICES MANUFACTURED FROM CONDUCTIVE LOADED RESIN-BASED MATERIALS This patent application claims priority to the U.S. Provisional Patent Application 60/461,877, filed on Apr. 10, 2003 and to the U.S. Provisional Patent Application 60/478,774, filed on Jun. 16, 2003 which are herein incorporated by reference in their entirety.

This patent application is a Continuation-in-Part of filed U.S. patent application Ser. No. 10/309,429, filed on Dec. 4, 2002 now issued as U.S. Pat. No. 6,870,516, also incorporated by reference in its entirety, which is a Continuation-in-Part application filed as U.S. patent application Ser. No. 10/075,778, filed on Feb. 14, 2002, now issued as U.S. Pat. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to heating devices and, more particularly, to heating devices molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

From common kitchen appliances to sophisticated temperature control devices for scientific application, resistive heating elements are ubiquitous in application. Most heating elements are highly resistive metal wire, such as nickel-chromium (nichrome) or tungsten, designed to provide the necessary resistance for the heating required. The resistance of the heating element is determined by the resistivity of the wire, its cross-sectional area, and its length. The heat generated by the heating element is determined by the current passing through the heating element. Typically, the heating element further comprises an outer layer of a material that serves as an electrical insulator and a thermal conductor.

Heat generated in a resistive heating element is transferred to heated objects by conduction, convection and/or radiation. Conduction heat transfer relies on direct contact between the heating element and the heated object. For example, the transfer of heat from an electric range to a metal pan is essentially by conduction. Convection heat transfer relies on fluid flow to transfer heat. For example, an egg cooking a pan of boiling water relies on convection currents to transfer heat from the metal pan through the water and to the egg. Water at the bottom of the pan is superheated causing it to lose density such that it rises. This rising superheated water transfers heat energy to the egg floating in the water. Conversely, the water at the top of the pan is cooler and denser and, therefore, falls to toward the bottom of the pan. A convection current is thereby established in the pan of water. Radiation heat transfer relies on electromagnetic energy (such as light) to transfer heat from the heating element to the object. For example, a cake baking in an electric oven will be heated, in part, by the radiated heat from the glowing heating element. Radiant heating in how the sun's energy reaches the earth. In practical application, the three means of thermal transfer are found to interact and frequently occur at the same time.

Resistive heating elements used in various heating systems and applications have advantages over, for example, combustion-based heating sources. Electric heating elements do not generate noxious or asphyxiating fumes. Electric heating elements may be precisely controlled by electrical signals and, further, by digital circuits. Electrical heating elements can be formed into many shapes. Very focused heating can be created with minimal heat exposure for nearby objects. Heating can be performed in the absence of oxygen. Fluids, even combustible fluids, can be heated by properly designed resistive heating elements.

However, resistive heating elements currently used in the art have disadvantages. Metal-based elements, and particularly nichrome and tungsten, can be brittle and therefore not suitable for applications requiring a flexible heating element. Further, the large thermal cycles inherent in many product applications and the brittleness of these materials will cause thermal fatigue. Other metal elements, such as copper-based elements, bring greater flexibility. However, if the application requires the resistive element to change or flex positions, then the resistive element will tend to wear out due to metal fatigue. Metal-based resistive heating elements are typically formed as metal wires. These elements are expensive, can require very high temperature processing, and are limited in shape. In addition, when a breakage occurs, typically due to fatigue as described above, then the entire element stops working and must be replaced.

Several prior art inventions relate to electrically conductive plastics. U.S. Pat. No. 4,197,218 to McKaveney describes electrically conductive articles. The articles are formed from a non-conductive matrix containing an electrically conductive dispersion of finely divided ferroalloy, silicon alloy, or mixtures. U.S. Pat. No. 5,771,027 to Marks et al describes a composite antenna with a grid comprised of electrical conductors woven into the warp of a resin reinforced cloth forming one layer of the multi-layer laminate structure of the antenna. U.S. Pat. No. 6,249,261 to Solberg, Jr. et al details a direction-finding antenna constructed from polymer composite materials that are electrically conductive. The polymer composite materials replace traditional metal materials. U.S. Pat. No. 6,277,303 to Foulger describes conductive polymer composite materials. The conductive polymer composite material includes a minor phase material that has a semi crystalline polymer. The composite material further includes a conductive filler material dispersed in the minor phase material in an amount sufficient to be equal to or greater than an amount required to generate a continuous conductive network within the minor phase material. The composite material also incorporates a major phase material. The major phase material being a polymer which when mixed with the minor phase material will not engage in electrostatic interactions that promote miscibility. The major phase material has the minor phase material dispersed within it in an amount sufficient to be equal to or greater than an amount required to generate a continuous conductive network in the major phase material. This composite then forms a semiconductive ternary composite with distinct co-continuous phases.

U.S. Pat. No. 6,558,746 to Starz et al details a coating composition for producing electrically conductive coatings, containing one or more electrically conductive pigment and an organic binder. The coating composition, optionally, contains additives and auxiliary agents. The coatings thus obtained are especially well-bonded and resistant to mechanical influences and to solvents, and exhibit suitable conductivity (sheet resistivity) values. U.S. Pat. No. 6,602, 446 to Ushijima provides an electrically conductive paste made up of an electrically conductive filler combined with a heating element adapted to generate heat upon electromagnetic induction. The paste is then compounded with a resin. In addition, Nv Bekaert sa of Kortrijk, Belgium manufactures metal yarns, knitted metal fabric, chopped metal fibers and pellets, and sintered porous media. The fibers are marketed with diameters of from 1 μm to 20 μm and may be chopped into fiber pieces or be of continuous yarns. The metals shown in the product description found www.bekaert.com Jan. 25, 2003 are stainless steel, temperature resistant alloys, nickel and nickel alloys, titanium, aluminum, and copper. In the article, "I Want My Pizza Hot!," by Sbenaty, in the Journal of Science, Technology, Engineering and Math Education, January-April 2000, Volume 1, Issue 1 a design exercise describes a heating element for home delivery of food such as Pizza using a material that consists of a flexible conductive polymer material connected between integral copper bus wires.

In the article, "Nanocomposite Materials Offer Higher Conductivity and Flexibility", McCluskey, et al., Proceedings of 3rd International Conference on Adhesive Joining and Coating Technology in Electronics Manufacturing, 1998, pp: 282-286, describes the mechanical and electrical characteristics of a conductive polymer made with conductive silver flake nanoparticle fillers. The use of nanoparticle fillers allows the material to attain the same level of conductivity exhibited by traditional filled polymers at significantly lower particle loading. The conductive polymer combines the high conductivity and stability of a filled polymer with the flexibility and low density of an intrinsically conductive polymer. The nanoparticle metal fillers examined have dimensions between 200 nm and 20 μm, and when mixed with a non-conductive polymer matrix, they have a resistivity of from 10-100 Ohm-cm. Further, McCluskey et al. discusses that the onset of conductivity of a silver filled silicone begins with 65-75% ratio by weight of silver to the silicone for a 3 μm-20 μm particle size. A 200 nm particle has an onset of conductivity at 35-40% ratio by weight of silver to the silicone.

SUMMARY OF THE INVENTION

A principal object of the present invention is to provide effective heating devices.

A further object of the present invention is to provide a method to form heating devices.

A further object of the present invention is to provide a heating device molded of conductive loaded resin-based materials.

A yet further object of the present invention is to provide heating devices molded of conductive loaded resin-based material where the heating device characteristics can be selected based on the doping of conductive materials in a resin-based material.

A yet further object of the present invention is to provide heating devices molded of conductive loaded resin-based material where the heating device characteristics can be selected based on the characteristics of the selected resin-based material.

A yet further object of the present invention is to provide methods to fabricate heating devices from a conductive loaded resin-based material incorporating various forms of the material.

A yet further object of the present invention is to provide a range of heating devices with heating elements of a conductive loaded resin-based material.

In accordance with the objects of this invention, a heating device is achieved. The heating device comprises a heating element comprising a conductive loaded, resin-based material comprising conductive materials in a base resin host. A first terminal is connected at a first end of the heating element. A second terminal is connected at a second end of the heating element.

Also in accordance with the objects of this invention, a heating device is achieved. The heating device comprises a heating element comprising a conductive loaded, resin-based material comprising conductive materials in a base resin host. The conductive materials comprise a combination of conductive powder and conductive fiber. An electrically insulating layer surrounds the heating element. A first terminal is connected at a first end of the heating element. A second terminal is connected at a second end of the heating element.

Also in accordance with the objects of this invention, a method to form a heating element device is achieved. The method comprises providing a conductive loaded, resin-based material comprising conductive materials in a resin-based host. The conductive loaded, resin-based material is molded into a heating element device.

BRIEF DESCRIPTION OF THE DRAWINGS

In the accompanying drawings forming a material part of this description, there is shown:

FIGS. 1a and 1b illustrate a first preferred embodiment of the present invention showing heating devices comprising a conductive loaded resin-based material.

DESCRIPTION OF THE PREFERRED EMBODIMENTS

Figure 2:
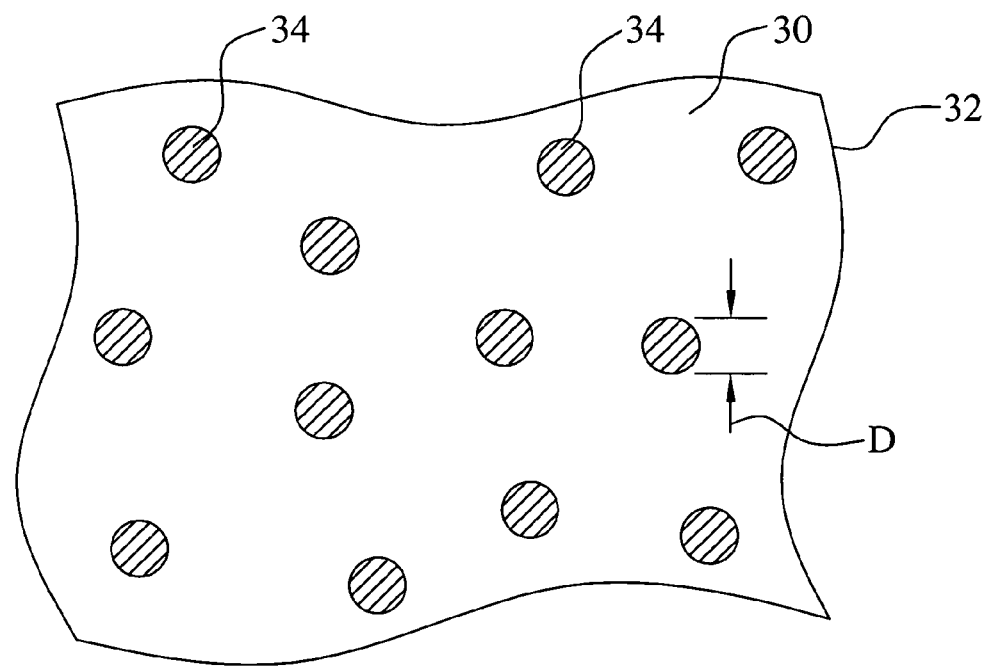
FIG. 2 illustrates a first preferred embodiment of a conductive loaded resin-based material wherein the conductive materials comprise a powder.

This invention relates to heating devices molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of heating devices fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the heating devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of heating devices significantly lowers the cost of materials and the design and manufacturing processes used to hold ease of close tolerances, by forming these materials into desired shapes and sizes. The heating devices can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heating devices. The doping composition and directionality associated with the micron conductors within the loaded base resins can affect the electrical and structural characteristics of the heating devices, and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers, or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming heating devices that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in heating element applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

An additional and important feature of the present invention, the molded conductor loaded resin-based material exhibits excellent thermal conduction characteristics. Therefore, heating devices manufactured from the molded conductor loaded resin-based material can provide added thermal transfer capabilities to the application.

Referring now to FIGS. 1a and 1b, a first preferred embodiment of the present invention is illustrated. Several important features of the present invention are shown and discussed below. Referring now to FIG. 1a, a resistive heating element 12 of conductive loaded resin-based material according to the present invention is illustrated. This heating element 12 comprises a solid strip of conductive loaded resin-based material 16 that is connected to an electrical power source $V_{heat}$ 14. The conductive loaded resin-based material is electrically conductive. The bulk resistivity or the material can be easily adjusted by adjusting the relative amount(s) of or the type(s) of conductive materials in the base resin. The resistance of the heating element 12 is the product of the bulk resistivity of the conductive loaded resin-based material and the linear distance of the element divided by the cross sectional area of the element. The base resin material is chosen based on many factors, such as mechanical strength, flexibility, appearance, corrosion/electrolysis resistance, flame retardant characteristics, chemical characteristics, process characteristics, transparency/opaqueness, cost, etc., and on the thermal requirements of the application. For example, the glass transition temperature or maximum operating temperature of the molded resin-based material must be considered when selecting the material for a given heating element application. Very high temperature base resin materials, such as those capable of over 1000° C. operation, may be used to achieve very high temperature resistive elements of conductive loaded resin-based material according to the present invention.

In this example, the element 12 is U-shaped such that current $I_{heat}$ flows from the source $V_{heat}$ 14 through the top leg/terminal and returns through the bottom leg/terminal. As the current $I_{heat}$ is transmitted, heat is generated in element 12 according to $I^2R$. Due to the excellent thermal conductivity of the conductive loaded resin-based material, the $I^2R$ heat energy is conducted to the outer surfaces of the element. This heat energy can then be transferred away from the element 12 by conduction, convection, or radiation depending on the application and environmental conditions into which the element 12 is placed. In the example, a direct current (DC) is applied to the element 12. However, alternating current (AC) could easily be applied as would be the case if the element 12 is powered by a utility supply line such as in a residential or industrial setting.

The cross sectional representation of FIG. 1a shows the lattice structure 16 of the network of conductive fibers and/or powders in the base resin. This network 16 of conductive fibers and/or powders is also present at the surface of the element 12 but is not shown in the top view for ease of illustration. The heating element 12 of the present invention illustrated in FIG. 1a has no outer insulation. That is, objects or fluids on the surface of this element 12 would be in direct contact with conductive material and could become part of an electrical circuit. In most cases, this is not a desirable thing. Therefore, electrically insulating materials 18 and 20 may be formed onto the conductive loaded resin-based material 16 as in the second cross section 17. The electrically insulating materials 18 and 20 may comprise materials that have a large thermal conductivity or that have a small thermal conductivity. In the case of radiant heat emission, the electrically insulating material 18 and 20 may comprises a material selected for high transmittance of electromagnetic energy at particular wavelengths. Alternatively, if the heating element 12 is applied as a warming pad, then it would useful to form a top-side electrical insulator 20 of a material that is thermally conductive so that the heat generated by the element 12 conducts to the object sitting on the pad. In this case, the bottom-side electrical insulator 18 should comprise a material that is both electrically and thermally insulating such that heat from the element 12 is not lost in the downward direction. Alternatively, the topside and bottom-side electrically insulating layers 20 and 18 may comprise the same material.

The electrical insulator materials 18 and 20 include, but are not limited to, high temperature resin-based materials, metal oxides, polycarbonate materials, ceramics, and mica. The electrical insulator materials 18 and 20 may be applied by dipping, spray, coating, plating, over-molding, extrusion, adhesive application, and the like. In the second cross section 17, the electrical insulator materials 18 and 20 only cover the horizontal surfaces of each leg of the element 12. Alternatively, the entire surface area of the conductive loaded resin-based heating element 16 may be covered by an electrically insulating layer 22 as is shown in the third cross section 19. This layer may or may not bridge the gaps 13 between legs of the heating element 12. If this electrically insulating layer 22 does bridge the gaps 13 then this electrically insulating layer 22 can increase the mechanical strength and the thermal surface area of the heating element 12.

As another optional feature, a metal layer 24 may be formed over the surface of the conductive loaded resin-based material as shown in the fourth and fifth cross sections 21 and 23. In the fourth cross section 21, the metal layer 24 is formed directly onto the conductive loaded resin-based material 16. In the fifth cross section 23, an electrically insulating layer 25 is first formed over the conductive loaded resin-based material and then a metal layer 27 is formed. The addition of a metal layer 24 or 27 to the heating element 12 alters the electrical, thermal, visual and surface characteristics of the resulting composite structure. If the metal layer 24 is formed directly onto the conductive loaded resin-based material 16, then this metal layer 24 may be formed by plating or by coating. If the method of formation is metal plating, then the resin-based structural material of the conductive loaded, resin-based material 24 is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer 24 may be formed by, for example, electroplating or physical vapor deposition. Similarly, if a resin-based material is used for the electrically insulating material 25 of the fifth cross section 23, then this resin-based material 25 is preferably one that can be metal plated as above. Additional alternative embodiments, not shown, include multiple insulating layers, embedding conductors and/or other structures in the conductive loaded resin-based material 16 or in the electrically insulating layers 18, 20, 22 and 25, and/or embedding electrically insulating layer(s) inside the conductive loaded resin-based element 12.

Figure 7:
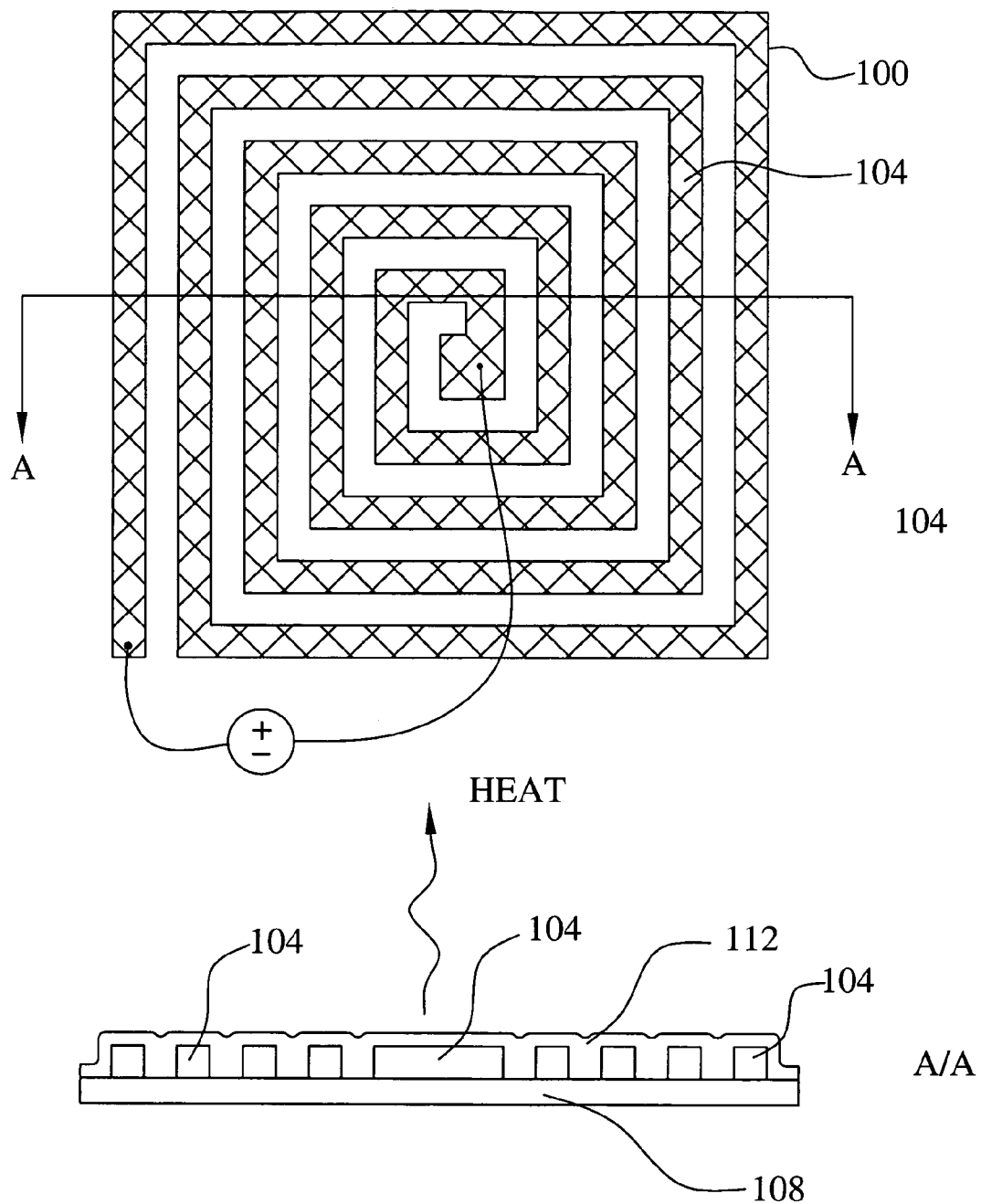
FIG. 7 illustrates a second preferred embodiment of the present invention showing a conductive loaded resin-based heating device in the form of a spiral heating pad.

Referring now to FIG. 7, a second preferred embodiment 100 of the present invention is illustrated. A resistive heating element 100 is formed of conductive loaded resin-based material according to the present invention. The element 100 is shaped into a spiral with an outer terminal 105 and an inner terminal 106. This arrangement is particularly useful for forming a large planar surface area for heat transfer by conduction, convection, or radiant heating. As shown in the cross section, the conductive loaded resin-based heating element 104 is preferably encased in electrically insulating materials 108 and 112. For example, the spiral pattern of conductive loaded resin-based material may be over-molded onto an electrically insulating substrate 108. Then a thin film of electrically insulating layer 112 may be formed over the spiral pattern 104 by spraying, dipping, or the like. The top insulating layer 112 provides a non-conductive working surface that prevents electrical shock while conducting heat from the element 110 to any object in contact with the surface 112.

The spiral element 100 exhibits very rapid heating and is particularly useful for applications such as electric hot plates and electric cook tops. The spiral element 100 may be formed of a flexible materials by selecting a flexible base resin in the conductive loaded resin-based material 104 and flexible resin-based insulators 108 and 112. In this case, the spiral element 100 will flex and is, therefore, particularly useful for direct contact applications to non-planar surfaces. The spiral element 100 may be applied to an object by adhesives or by other mechanical keeps such that non-horizontal applications are possible. For example, the spiral element 100 may be applied to computer displays or other electrical devices operating in very low temperature in avionics applications. The spiral element 100 may be applied to the backside of a mirror to provide defrosting and defogging in vehicular applications or to prevent steaming in restroom/shower applications. The spiral patterned conductive loaded resin-based heating element 100 can be modified in many ways while remaining within the scope of the present invention. While a square pattern is illustrated, any shape can by used including round, elliptical, complex perimeters, three-dimensional perimeters, and the like.

Figure 8A:
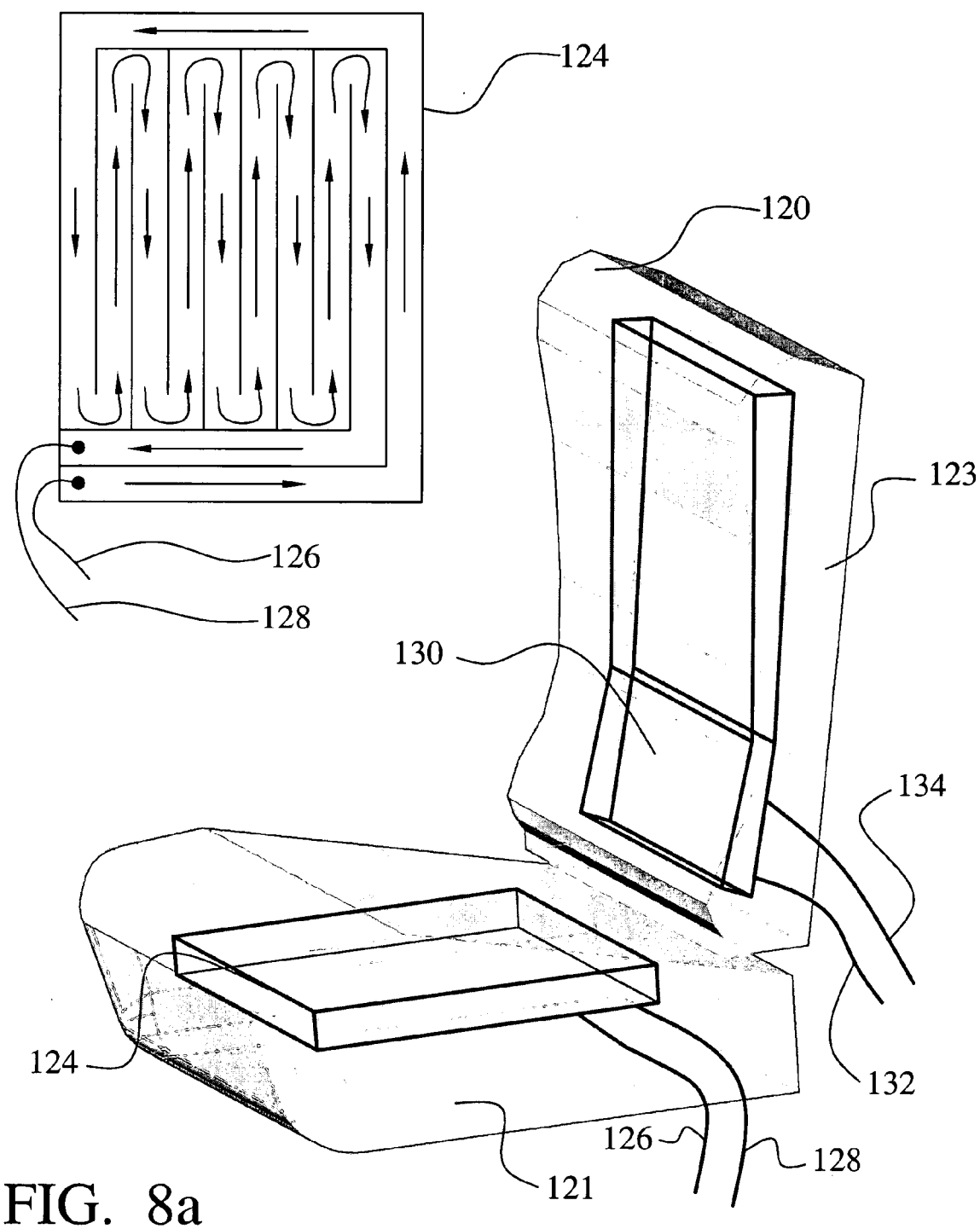
FIGS. 8a and 8b illustrate a third preferred embodiment of the present invention showing a conductive loaded resin-based heated seat device.
Figure 8B:
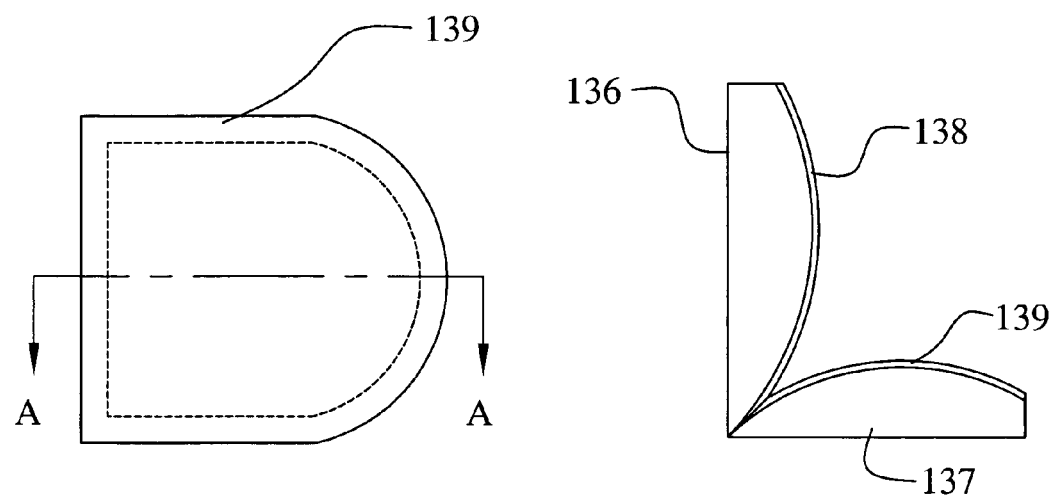
Figure 8B:
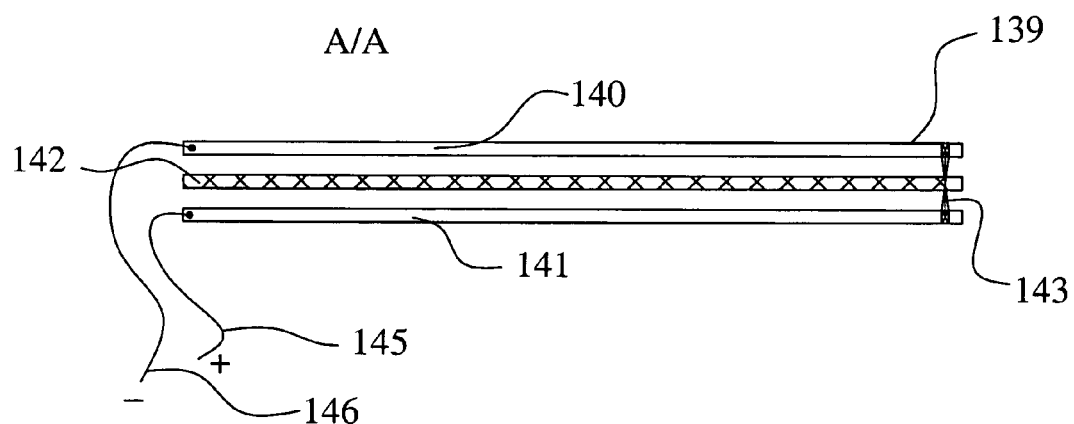

Referring now to FIG. 8a, a third preferred embodiment 120 of the present invention is illustrated. In this case, a heated seat 120 is shown. Resistive heating elements 124 and 130 according to the present invention are embedded in a chair or seat assembly 120. A lower heater 124 is embedded in the lower section 121 of the seat assembly. A back heater 130 is embedded in the back section 123 of the seat assembly 120. Alternatively, only a lower heater 124 or a back heater 130 may be used or a single heater element may be configured that extends through both the lower section 121 and the back section 123. The heating elements 124 and 130 comprise conductive loaded resin-based material according to the present invention. The elements 124 and 130 may be spiral patterns, as in FIG. 7, or may use an alternating pattern as shown in FIG. 8a. Alternatively, a homogenous pad with no pattern of lines or legs may be used as shown in FIG. 8b. The heating elements 124 and 130 are electrically insulated as described above.

By constructing the heating elements from the conductive loaded resin-based material, a multitude of current paths exist in the network of micron conductive fibers and/or powders in the material. Therefore, the heating elements 124 and 130 are highly reliable in terms of mechanical and electrical fatigue. By comparison, typical heated seat applications use continuous loops of nichrome wire. The constant flexing of the lower seat and seat back causes mechanical fatigue of the nichrome element and results in breakage. Because these prior art systems are based on a single wire, any breakage results in an open circuit and non-operation of the heater. The heating elements 124 and 130 of the present invention inherently provide multiple current paths to improve reliability. The element will continue to work even if part of it is cracked. Further, the flexibility of the base resin absorbs the flexing energy due to occupant movements and thereby improves reliability.

Each element 124 and 130 is connected to the power supply by a pair of wires 126 and 128 or 132 and 134. Temperature sensing and controlling devices and circuits, not shown, may be used to provide comfortable heating for the seat occupant. This type of seat heating device is particularly useful for vehicular applications to relieve poor circulation on long drives of to provide warmth on a cold winter day. Additionally, heat seats may be useful for air travel, office applications, recreational vehicles, hospital beds, and home furniture.

Referring now to FIG. 8b, another embodiment 139 of the seat heating element is illustrated. In this case, the seat/back heating element 139 is divided into a top section 140 and a bottom section 141. Both top and bottom sections 140 and 141 comprise conductive loaded resin-based material according to the invention. A middle insulating layer 142 electrically insulates the top section 140 from the bottom section 141 such that the electrical connections 145 and 146 can be made at a single end of the heating element 139. The top and bottom sections 140 and 141 are electrically connected at the opposite end by conductive staples, conductive wire, or conductive thread 143.

Figure 9:
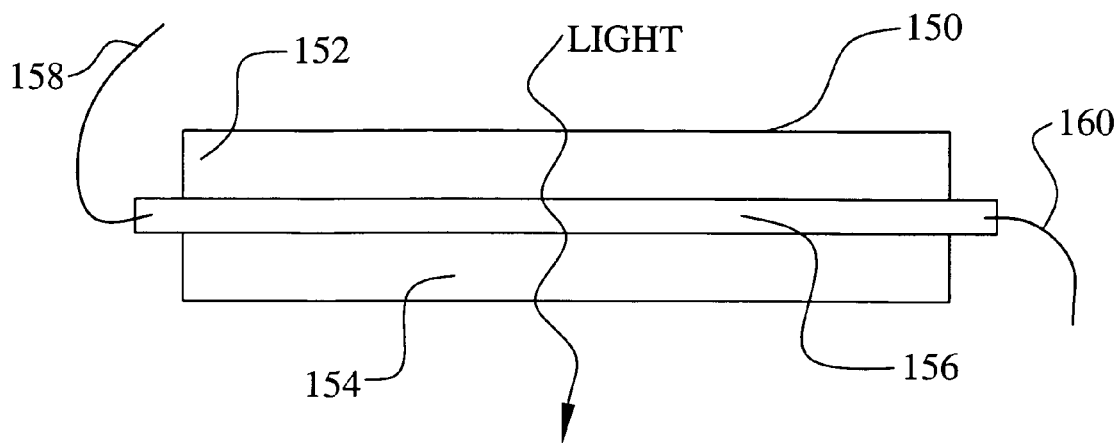
FIG. 9 illustrates a fourth preferred embodiment of the present invention showing a conductive loaded resin-based heated window device.

Referring now to FIG. 9, a fourth preferred embodiment 150 of the present invention is illustrated. A heated window 150 is shown. As in the case of heated mirrors, windows are heated to prevent fogging, steaming, or icing. Unlike mirrors, however, the window heating method must be configured so as not to interfere with the transmission of light through the window. Prior attempts to provide heated windows use methods such as running loops, or grids, of very fine metal wires in a transparent film adhered to the window or applying a transparent conductive film of indium tin oxide (ITO) to the window. In the present invention, a conductive loaded resin-based material 156 is brought into intimate contact with a transparent panel 152 or, in this case, laminated between two window panes 152 and 154. The base resin of the conductive loaded resin-based material 156 comprises a transparent material. The micron conductive fibers and/or powders are not transparent. However, the small size of the micron conductive fibers and/or powders homogeneously mixed in the resin base, combined with a careful selection of doping density, allows sufficiently unimpeded vision through the conductive loaded resin-based panel 156. The panel element 156 is electrically connected at opposite ends 158 and 160 and may be connected to a vehicle battery source or an AC source. This heating element 156 can be extruded into thin sheets for ease of manufacture. This window heating device 156 is useful for a range of applications including information displays, military vehicles, naval fight deck equipment, control panels on heavy equipment and agricultural equipment, periscopes, and off-shore drilling platforms.

Figure 10:
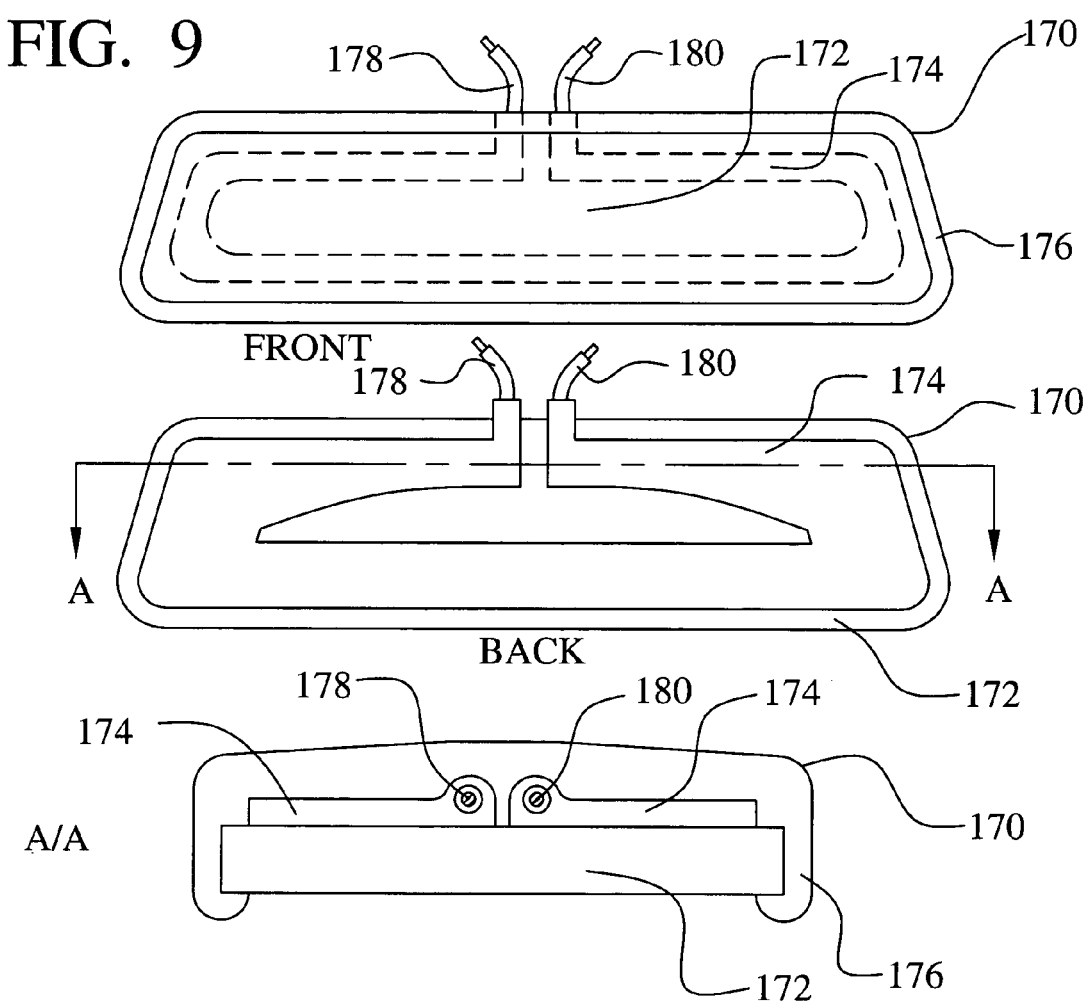
FIG. 10 illustrates a fifth preferred embodiment of the present invention showing a conductive loaded resin-based heated mirror device.

Referring now to FIG. 10, a fifth preferred embodiment 170 of the present invention is illustrated. A heated mirror 170 is shown. The heated mirror 170 comprises a mirror assembly 170 with a conductive loaded resin-based heating element 174 contacting the backside of a reflective panel 172. As shown in the cross section, the mirror panel 172 and the heater element 174 may be molded into the mirror housing 176. The heater element can be easily injection molded to the exact size and shape needed. Wires 178 and 180 connect the heater element 174 to the power supply, not shown. By selecting an insulating plastic molding and mirror panel (glass), the heater element 174 may not require an insulating layer. A rear-view mirror 170, such as is typically found on an automobile, is shown. However, the present invention is also useful for outside vehicle mirrors. In addition, the conductive loaded resin-based heating element may be applied to the backside of a bathroom/shower mirror to prevent fogging or steaming.

Figure 11:
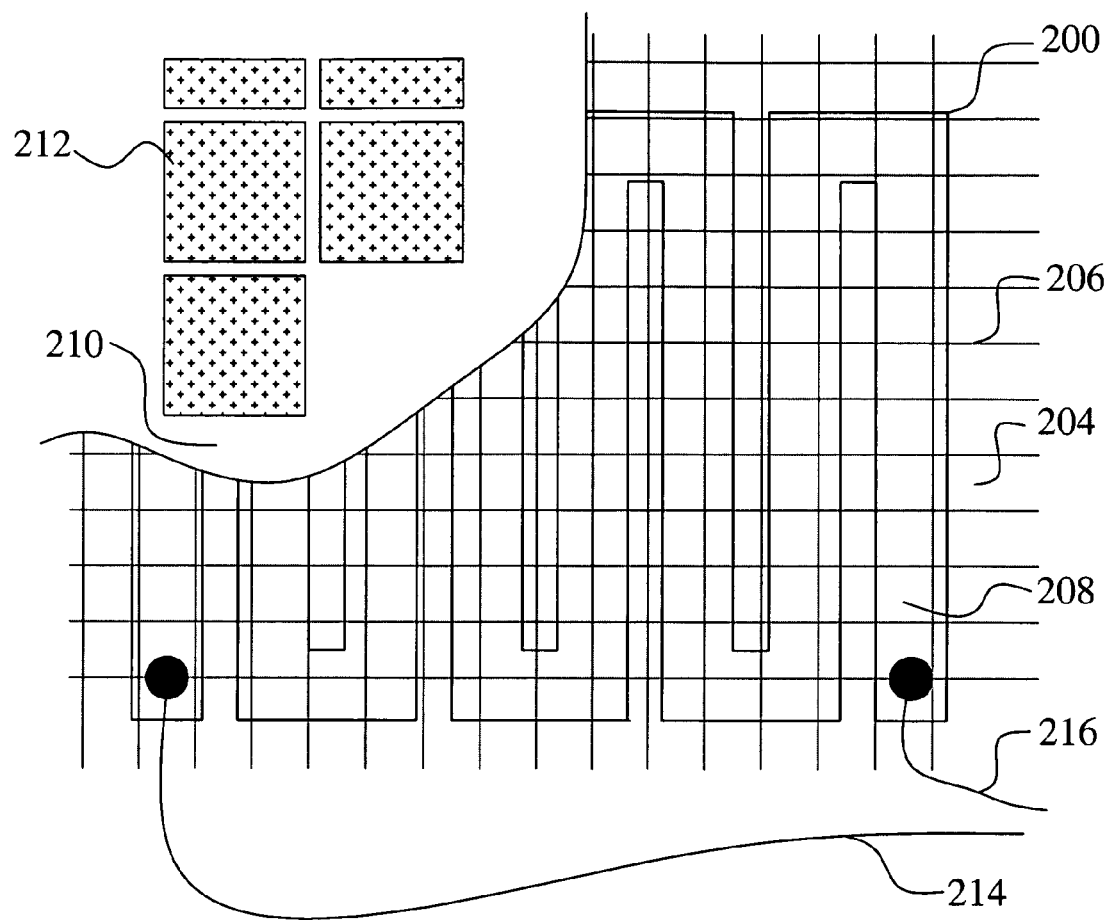
FIG. 11 illustrates a sixth preferred embodiment of the present invention showing a conductive loaded resin-based radiant floor heating device.
Figure 11:
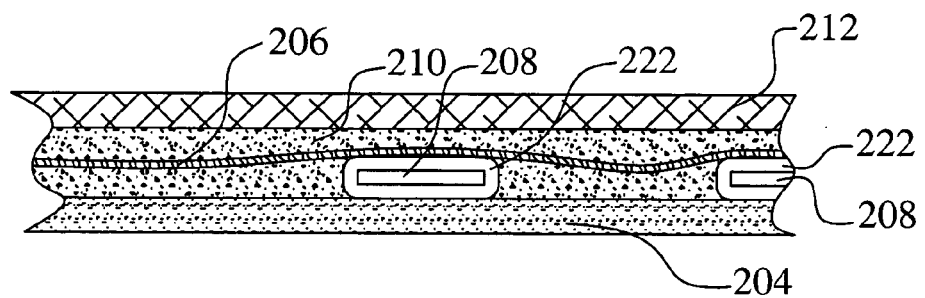

Referring now to FIG. 11, a sixth preferred embodiment of the present invention is illustrated. In this embodiment, a radiant floor heater 200 is formed according to the present invention. Radiant floor heating systems offer unique advantages over typical forced air heating systems found in many homes. By warming the floor, the perceived temperature of the room, especially tiled floor bathroom, is increased. In addition, an even heating of the room is achieved. Finally, problems of air contamination and filtration are eliminated since the systems do not relay on air movement (convection) to heat the room/house. Typical radiant floor heating systems uses loops of metal wire for the heating elements. A preferred embodiment of a heating element 208 according to the present invention comprises conductive loaded resin-based material. A heating element 208 with continuous loop structure 200 may be formed, for example, by extruding a thin sheet of conductive loaded resin-based material and then stamping the looping pattern into the sheet.

The heating element conductive material 208 is surrounded by an electrically insulating material 222. The heating element 200 is laid onto a floor surface 204, such as a concrete slab floor or a concrete-based leveler material overlying a wood floor. An optional mesh 206 may be attached to the heating element 200 to provide a mechanical stabilizer and a reinforcement for the tiling mud 210. The tiling mud or mortar is flowed over the heating element 200 and optional mesh to create a foundation for the placement of tiles 212. This floor heating element 200 of the present invention is particularly useful for residential bathrooms and basements.

Figure 12:
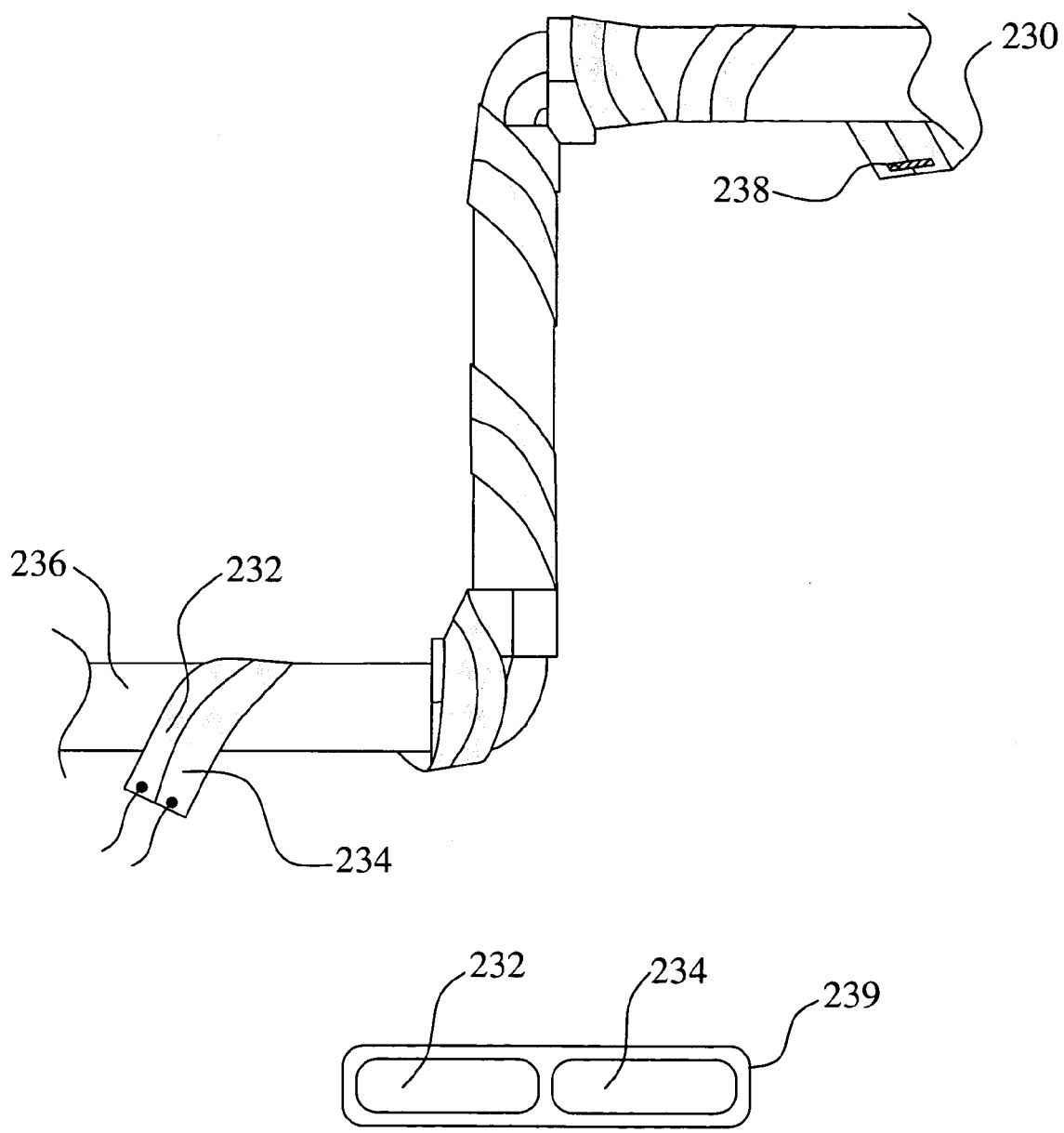
FIG. 12 illustrates a seventh preferred embodiment of the present invention showing a conductive loaded resin-based heat tape device.

Referring now to FIG. 12, a seventh preferred embodiment of the present invention is illustrated. In this embodiment, a heating tape 230 is formed of conductive loaded resin-based material according to the present invention. Heating tape 230 is used to provide localized heating of fluid piping 236 to prevent freezing. A typically application is cold water piping 236 in residential crawl spaces or garages. Typical heating tapes are formed of metal wire embedded in rubber. A preferred embodiment of a heating tape 230 according to the present invention comprises conductive loaded resin-based heating elements 232 and 234, and a termination strap 238. The termination strap 238 electrically connects the heating elements 232 and 234 at the end of the tape 230 opposite the electric power wires. The heating elements 232 and 234 are otherwise electrically isolated by the external insulator 239. The heating elements 232 and 234 are formed of a flexible base resin. The insulating layer 239 is also formed of flexible resin. An exemplary manufacturing process is to first form the conductive loaded resin-based heating elements 232 and 234 by extrusion and then to extrude the insulating layer 239 over the heating elements 232 and 234.

Figure 13:
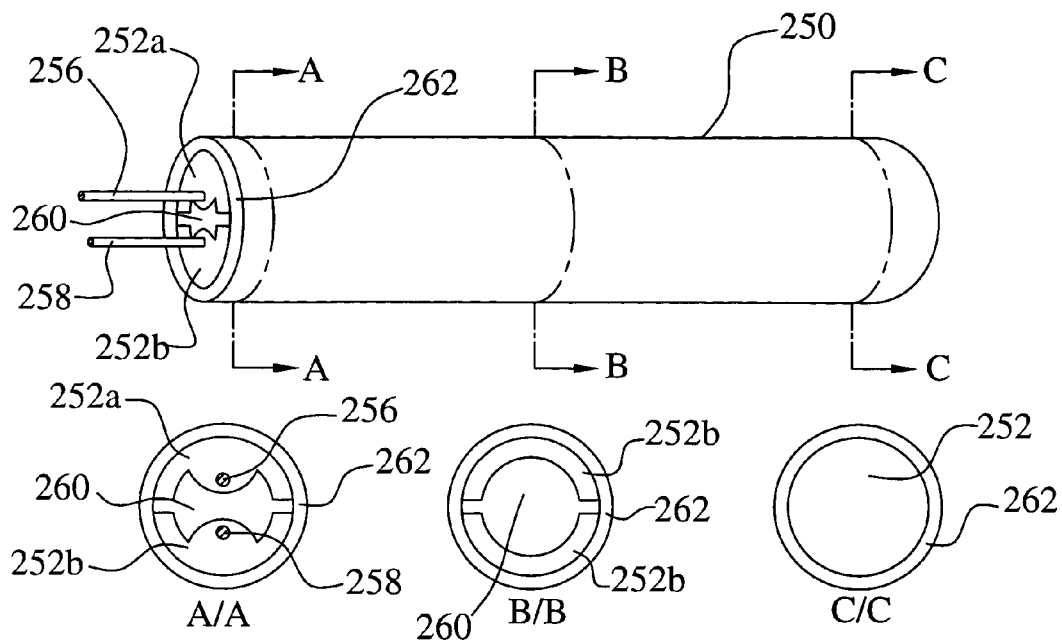
FIG. 13 illustrates a eighth preferred embodiment of the present invention showing a conductive loaded resin-based cartridge heater device.

Referring now to FIG. 13, an eighth preferred embodiment of the present invention is illustrated. A cartridge heater device 250 is formed using a conductive loaded resin-based heating element of the present invention. Cartridge heater devices are used in the art to provide localized heating to restricted work areas requiring close thermal control. Many commercial and industrial applications, such as compressor crankcase heating, copiers, dies, food processing, plastic molds, wax pots, and the like, use cartridge heaters. Typical cartridge heaters use an insulated nichrome wire as the heating element and package the wound element in a sealed metal case. A preferred embodiment of a cartridge heater device 250 according to the present invention is shown as a conductive loaded resin-based heating element 252a and 252b with an insulating layer core 260 and an insulating layer exterior 262. In the exemplary cartridge, the heater element 252 may be injection molded around the core insulator 260. Metal wires 256 and 258 connect the cartridge to the electrical power source, not shown. The heating element is a U-shape such that the top element leg 252a and bottom element leg 252b join at the end opposite the wire connectors 256 and 258. A metal layer, not shown, may optionally be plated onto the outside of the cartridge 250 to alter the thermal characteristics if needed.

Figure 14:
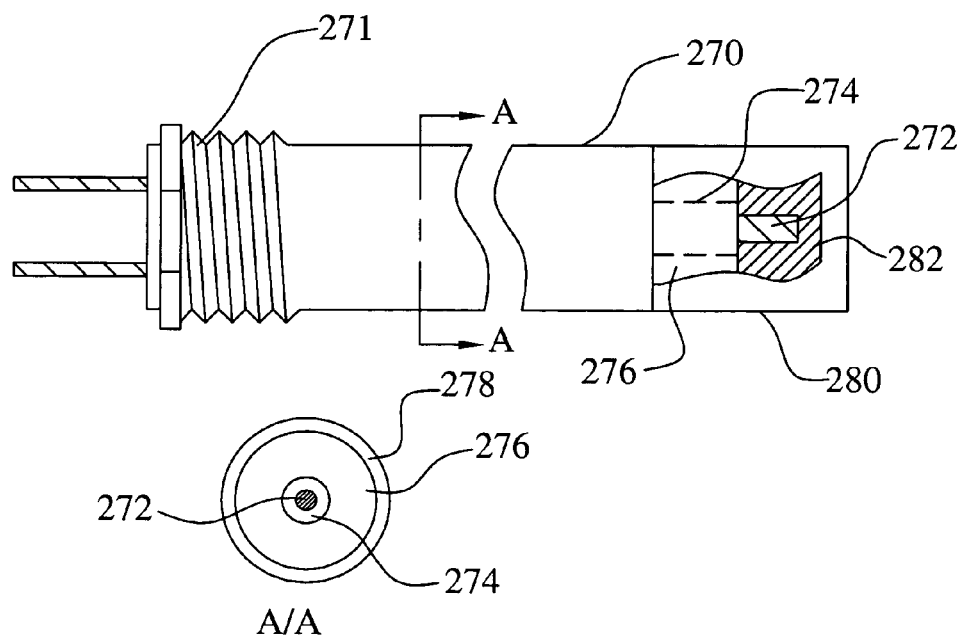
FIG. 14 illustrates a ninth preferred embodiment of the present invention showing a conductive loaded resin-based immersion heater device.

Referring now to FIG. 14, an ninth preferred embodiment of the present invention is illustrated. An immersion heating device 270 is illustrated. Immersion heating devices are used to heat liquids. Immersion heaters are typically placed into a tank to provide precise heating control of a liquid contained in the tank. Typical immersion heaters are formed using insulated nichrome heating wires hermetically sealed inside of a metal tube. A preferred embodiment of an immersion heating device 270 according to the present invention is shown as a conductive loaded resin-based resistive element 276 sealed in an electrically insulating and liquid impenetrable resin-based shield 278. In this embodiment, the power terminals are connected at a terminal end 271 that is pipe-threaded. One wire connects to the terminal end 271 of the resistive element 276, while another wire connects to an insulated conductor 272 and 274 routed through the resistive element 276. At the end opposite the threaded terminal 271, an end cap of metal 282 encased in an insulating resin-based material 280 is used to connect the center conductor 272 to the conductive loaded resin-based material 276 to complete the heater circuit. Using this technique, the resistive heating element section, shown in cross section, may be formed by extrusion molding to any length and then cut to form specific sizes of immersion heaters 270.

Figure 15:
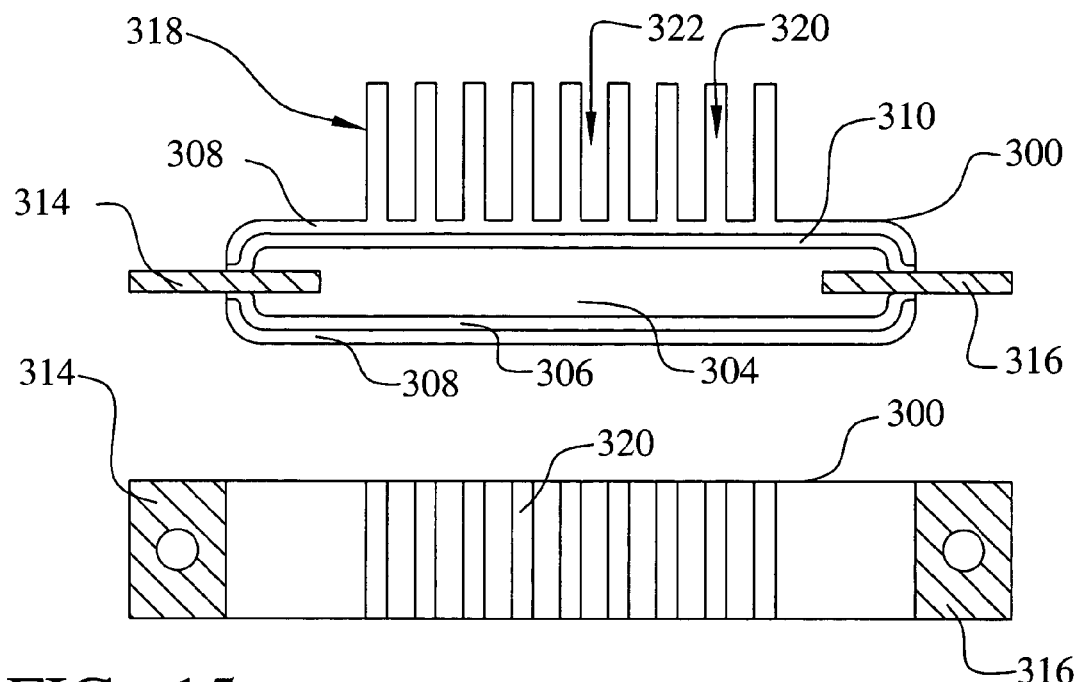
FIG. 15 illustrates a tenth preferred embodiment of the present invention showing a conductive loaded resin-based finned strip heater device.

Referring now to FIG. 15, a tenth preferred embodiment of the present invention is illustrated. A finned strip heater device 300 is illustrated. Finned strip heater devices are used to heat air in air ovens and load banks. Typical finned strip heaters are formed using insulated nichrome heating wires hermetically sealed inside of a metal housing and further use metal fins to transfer heat to the air. A preferred embodiment of a finned strip heater device 300 according to the present invention is shown as a conductive loaded resin-based resistive element 304 sealed in an electrically insulating layer 310. The resistive element 304 is a simple strip of conductive loaded resin-based material extending from one embedded terminal 314 to another embedded terminal 316. The outer case 308 is electrically isolated from the internal resistive element 304. However, heat generated in the element 304 is easily transferred into the outer case 308 where it is transferred into the air by the large surface area of the block of fins 318. Each fin 320 is separated by a gap 322. Additional fins may be formed on the bottom side of the case 308. The outer case 308 may comprise a stamped metal. However, as an optional feature, the outer case 308 may comprise conductive loaded resin-based material according to the invention. This material exhibits excellent thermal conductivity. A preferred method of forming the finned strip heater 300 is to over-mold the insulator layer 310 onto an injection molded resistive element 304. Then, the outer case 308 is over-molded onto the insulator-resistive element sub-assembly 304 and 310.

Figure 16:
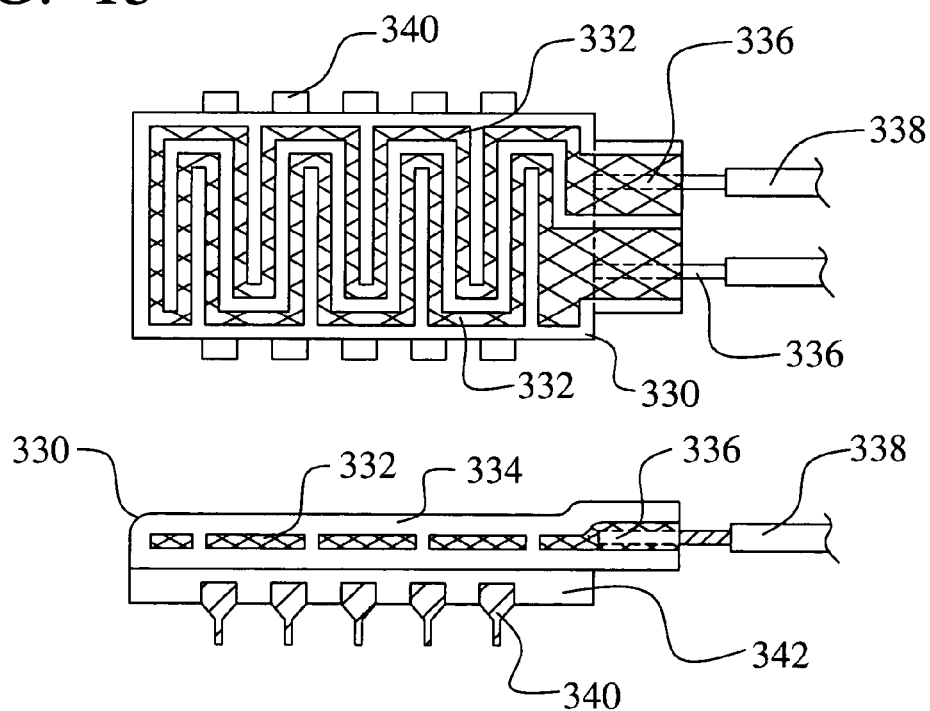
FIG. 16 illustrates a eleventh preferred embodiment of the present invention showing a conductive loaded resin-based flexible heating device to provide thermal compensation for an electronic device.

Referring now to FIG. 16, an eleventh preferred embodiment of the present invention is illustrated. A flexible heating device 330 is shown. Flexible heating devices are used in many applications to provide localized heating to objects of various shapes and sizes. Flexible heating devices are used, for example, to maintain proper operating temperatures on electronic components in extreme cold environments such as aviation. Typical flexible heating devices comprises an etched metal foil that is encased in an insulator. A preferred embodiment of a flexible heating device 330 according to the present invention is shown as a conductive loaded resin-based resistive heating element 332 formed into an interlaced loop. Wires 336 and 338 are embedded in the terminals of the heating element 332 to provide power. The resistive heating element 332 is encased in an electrically insulating layer 334. Preferably, the electrically insulating layer 334 comprises a resin-based material, and, more preferably, comprises the same material as the base resin of the resistive element 332. The flexible heating device 330 is intimately contacted to the heated object, in this case an integrated circuit device 342 and 340. An adhesive may be used to insure continuous contact between the heater device 330 and the object 342. The flexible heating device 330 may be formed, for example, by injection molding the resistive element 332 of homogeneously mixed conductive loaded resin-based material and then over-molding or coating the insulating layer 334 thereon.

Figure 17:
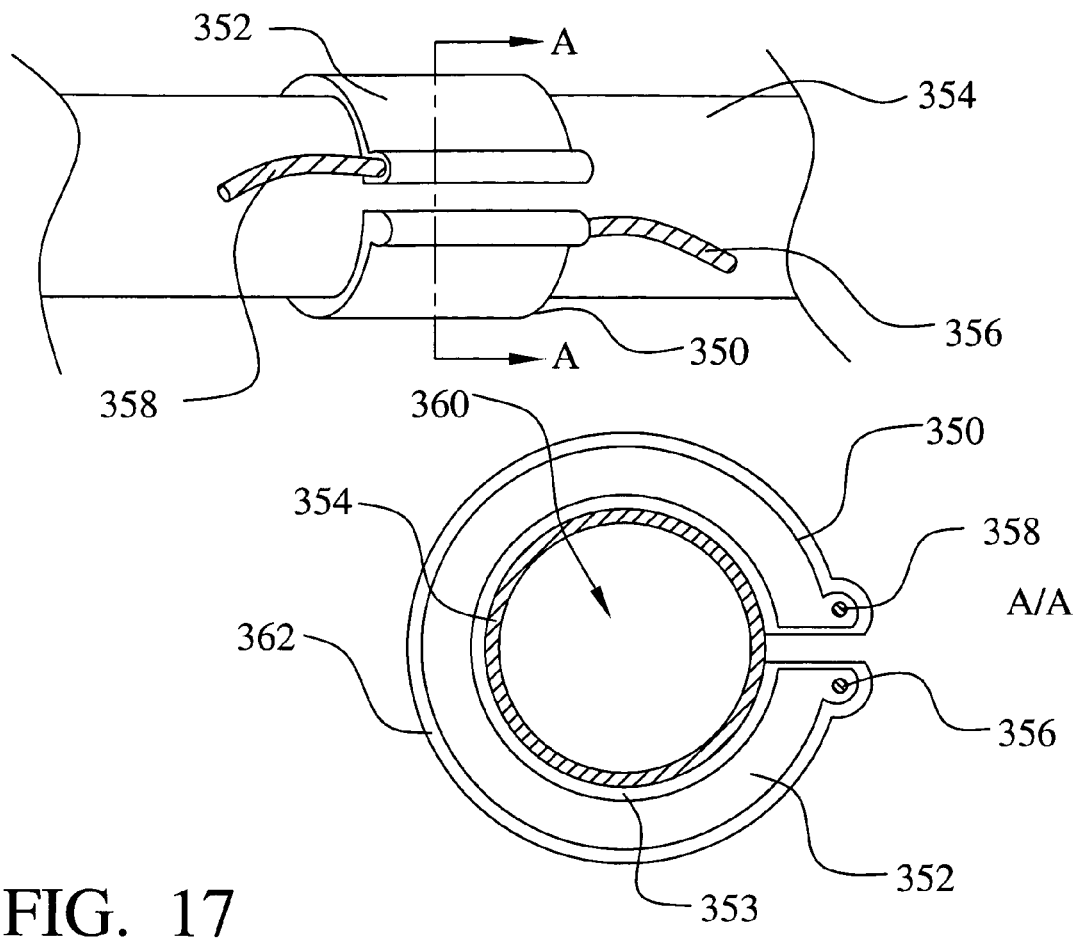
FIG. 17 illustrates a twelfth preferred embodiment of the present invention showing a conductive loaded resin-based strap or band heating device.

Referring now to FIG. 17, a twelfth preferred embodiment of the present invention is illustrated. A strap or band heating device 350 is shown. Band heating devices 350 are used to provide local heating of fluid 360 bearing pipes 354 to prevent ice formation or to control fluid 360 viscosity in many applications. Typical band heaters comprise an insulated nichrome wire embedded in metal ring that is clasped around a pipe. A preferred embodiment of a band heating device 350 according to the present invention is shown as a conductive loaded resin-based resistive heating element 352 embedded in a band of electrically insulating material 353 and 362. Terminal wires 356 and 358 are embedded into the resistive heating element 352 at each end of its circumference to supply power. The band heater device 350 may be formed, for example, by injection molding homogeneously mixed conductive loaded resin-based material. The insulating layers 353 and 362, which may comprise a single layer, are then formed by dipping or coating. As an additional preferred embodiment, the band may be made sufficiently flexible to allow "snap-on" clasping by selecting a flexible base resin for the conductive loaded resin-based material and a flexible resin-based material for the insulating layers 353 and 362.

Figure 18:
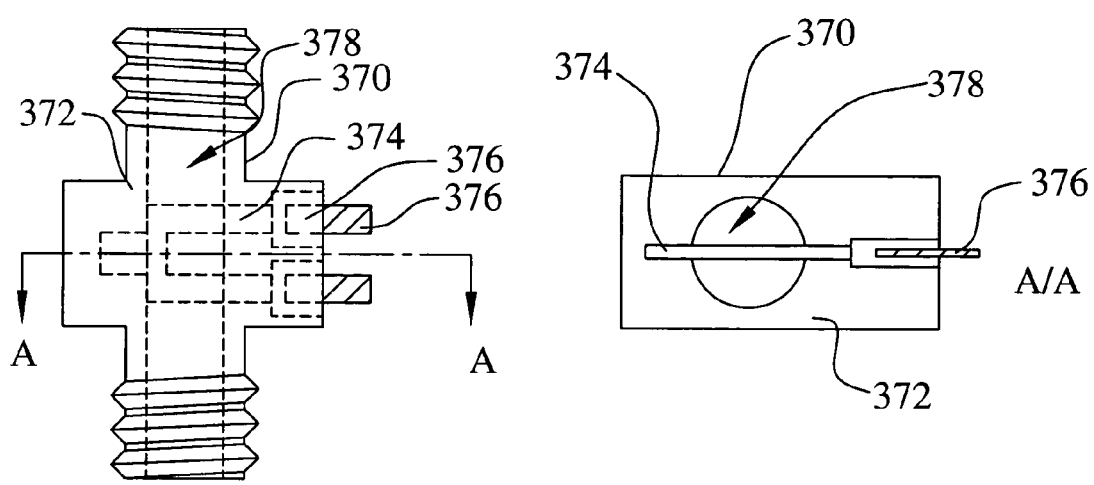
FIG. 18 illustrates a thirteenth preferred embodiment of the present invention showing a conductive loaded resin-based insert-molded heating tube device.

Referring now to FIG. 18, a thirteenth preferred embodiment of the present invention is illustrated. An insert-molded heating tube device 370 is shown. Heating tube devices are used to heat liquids that are transported within tubes or piping to prevent ice formation or to control fluid 378 viscosity in many applications. A preferred embodiment of an insert-molded heating tube device 370 according to the present invention is shown as a conductive loaded resin-based resistive heating element 374 embedded in a housing of electrically insulating material 372. The device 370 is preferably formed by first molding the conductive loaded resin-based heating element 374 and then over-molding of the housing 372 out of resin-based material. The electrical terminals 376 are embedded in the resistive element 374 to power the element.

Figure 19:
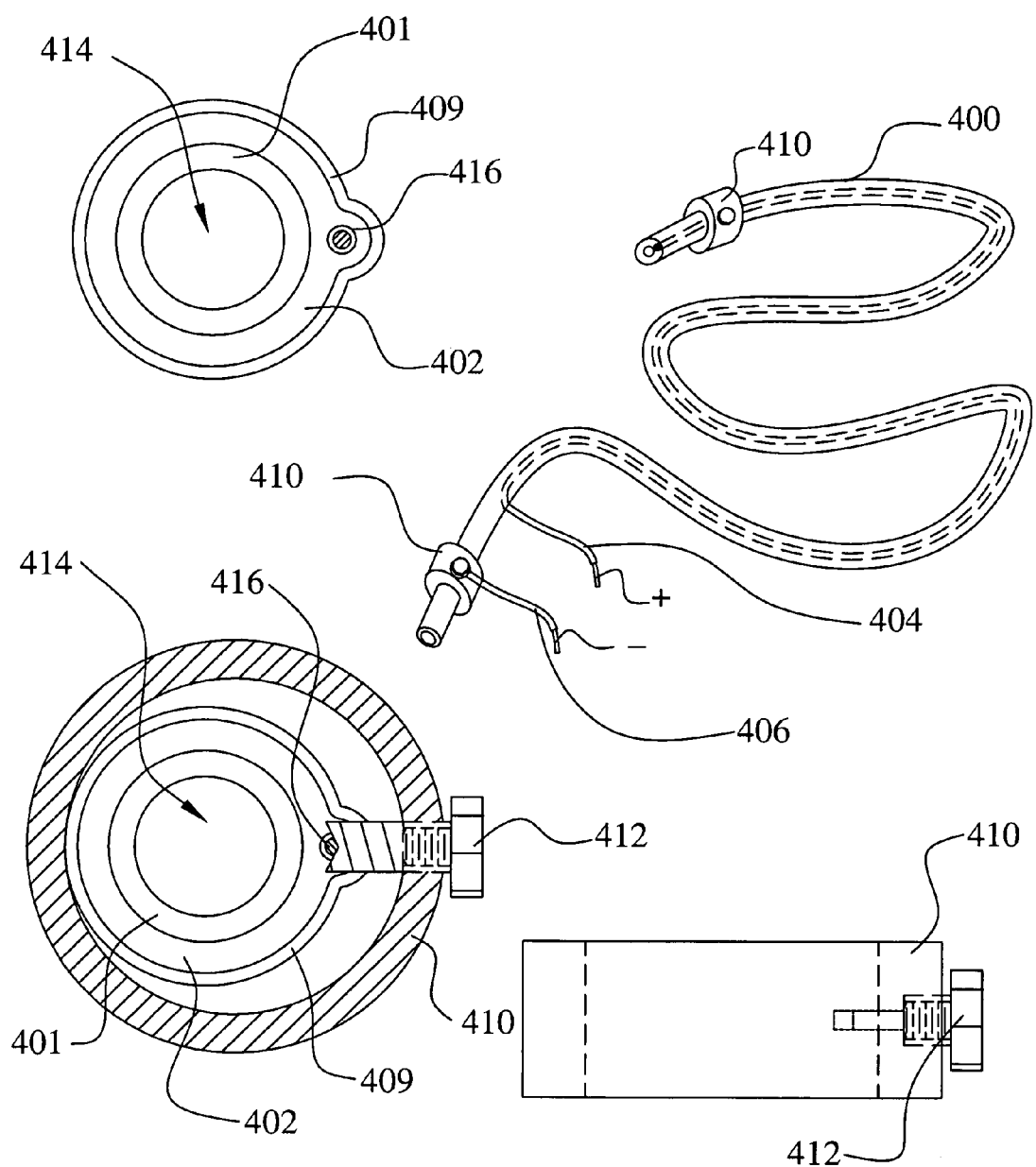
FIG. 19 illustrates a fourteenth preferred embodiment of the present invention showing a conductive loaded resin-based heating tube device.

Referring now to FIG. 19, a fourteenth preferred embodiment of the present invention is illustrated. A heating tube device 400 is shown. Tube heating devices are used to heat liquids that are transported within tubes or piping to prevent ice formation or to control fluid 414 viscosity in many applications. Typical tube heaters comprise a metal wire heating element embedded in a rubber tube. A preferred embodiment of tube heating device 400 comprises a transport tube of, for example, rubber 401 that is capable of transporting a fluid 414. A conductive loaded resin-based heating element 402 surrounds the transport tube 401. An electrically insulating layer 409 surrounds the heating element 402 to provide electrical isolation.

In the simplest form, the heating element may simply be contacted at each end of its length by exposing the conductive loaded resin-based material 402 and then mechanically clamping or pinning. Current is then forced through the length of the heating tube 400 by a power supply, not shown. To facilitate completion of the circuit, an insulated wire 416 may also be embedded into the conductive loaded resin-based material 402. This wire 416 facilitates circuit completion using a clamping/splicing mechanism 410 and 412 as is shown. In this embodiment, the clamping/splicing mechanism 410 and 412 comprises a metal splicer 412 that cuts through the wire 416 insulation and that embeds into the resistive element 402 to thereby connect the wire 416 and resistive element 402 at one end. At the opposite end, a clamping/splicing mechanism 410 and 412 is used only to contact the resistive element 402. Preferably, the base resin of the conductive loaded resin-based material 402 and of the insulating layer 409 each comprise flexible materials. Alternatively, the transport hose 401 may comprise the same material as the base resin of the conductive loaded resin-based material 402. The heating tube device 400 of this embodiment may be formed, for example, by co-extrusion where the transport tube 401 is extruded and then the transport tube 401 and the insulated wire 416 are pulled through a resistive element 402 extruder.

Figure 20:
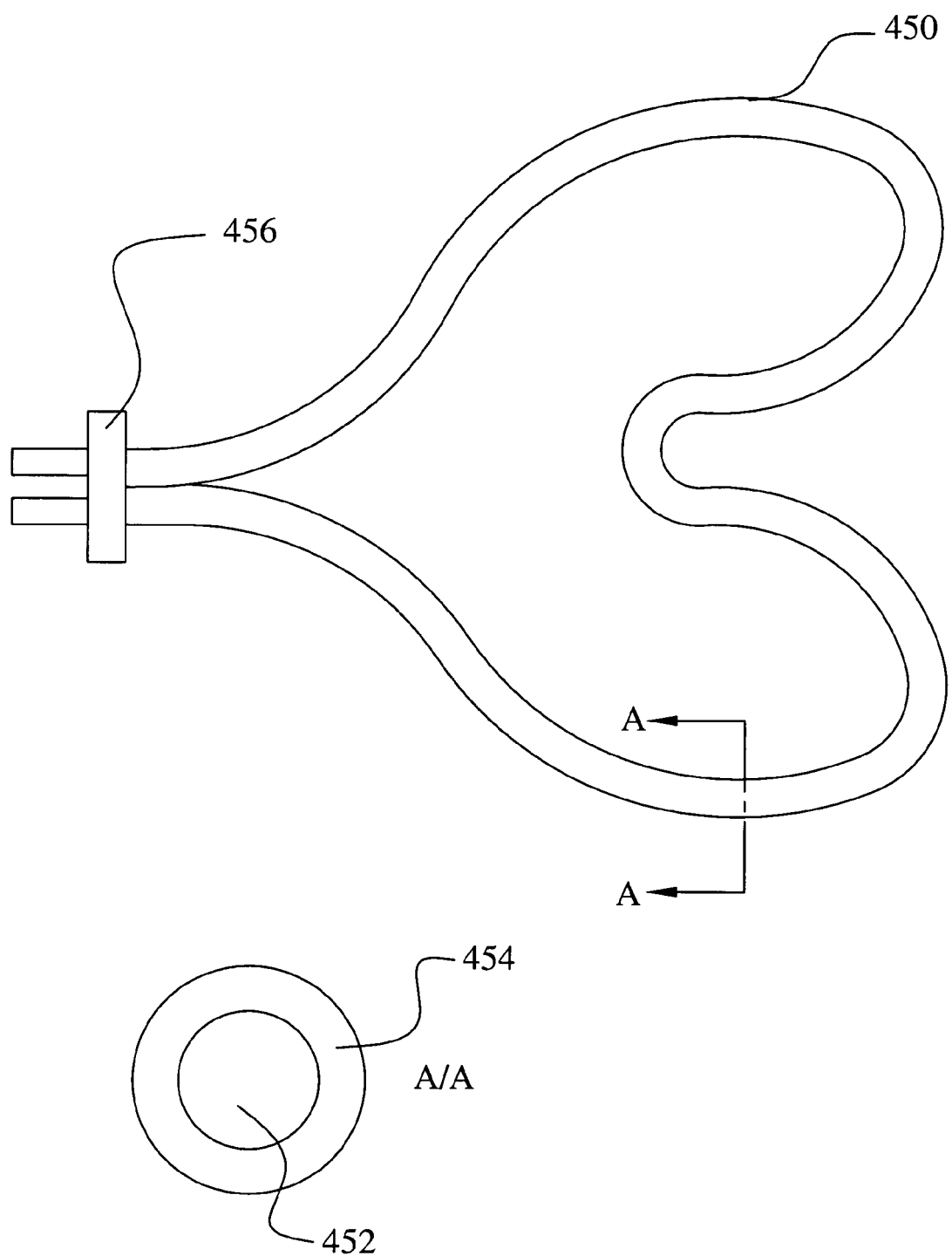
FIGS. 20 through 22 illustrate a fifteenth preferred embodiment of the present invention showing conductive loaded resin-based tubular heating devices as applied to hot water heaters and to heated towel racks.
Figure 21:
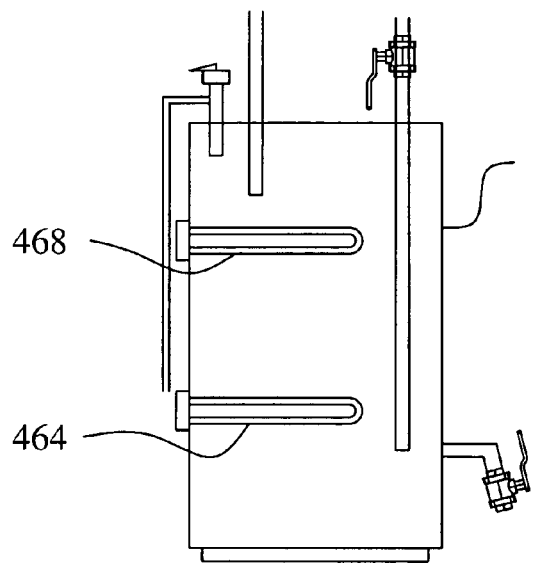
Figure 22:
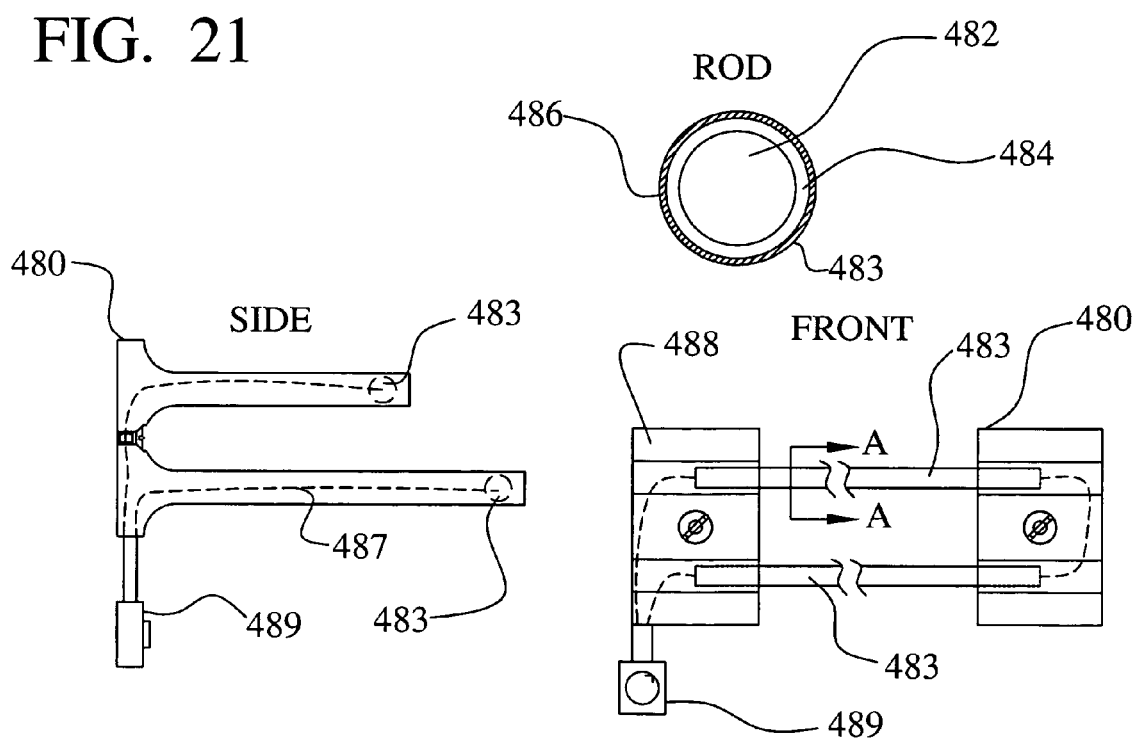

Referring now to FIGS. 20 through 22, a fifteenth preferred embodiment of the present invention is illustrated. Tubular heating devices are shown. Tubular heating devices are used for heating fluids and other materials in applications such as hot water heaters, restaurant warming trays, ovens, and the like. Typical tubular heaters comprise an insulated metal wire heating element sealed in a metal tube. Referring now particularly to FIG. 20, a preferred embodiment of a tubular heating device 450 according to the present invention is illustrated. The tubular heating device 450 comprises a conductive loaded resin-based core 452 surrounded by an electrically insulating layer 454. The tube 450 is formed into a looping shape as would be used, for example, in a food or water heating apparatus. A contacting terminal 456 provides electrical contact to each end of the resistive element 452 in the tube 450. The tubular heating device may be formed, for example, by extruding a flexible conductive loaded resin-based element 452, cutting and shaping the extruded element, and then coating the element with the insulating layer 454. Alternatively, the tubular heating element 452 may be formed by injection molding. Referring particularly to FIG. 21, a hot water heater apparatus 460 is shown with upper and lower tubular heating elements 464 and 468 of conductive loaded resin-based material.

Referring now particularly to FIG. 22, the tubular heating device according to the present invention is applied to a heated towel rack 480. Towel rods 483 are formed of conductive loaded resin-based heating elements 482. The heating elements 482 are again surrounded by an electrical insulating layer 484. In addition, an outer metal layer 486 may be coated or plated onto the insulating layer 484 to achieve a metal appearance. Each heating rod 483 is held in retaining mounts 488. The rods 483 are connected by wires 487 to a control unit 489 that regulates current flow through the rods 483 to control temperature. The tubular heating rods 483 may be formed, for example, by extrusion.

The conductive loaded resin-based material described herein typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
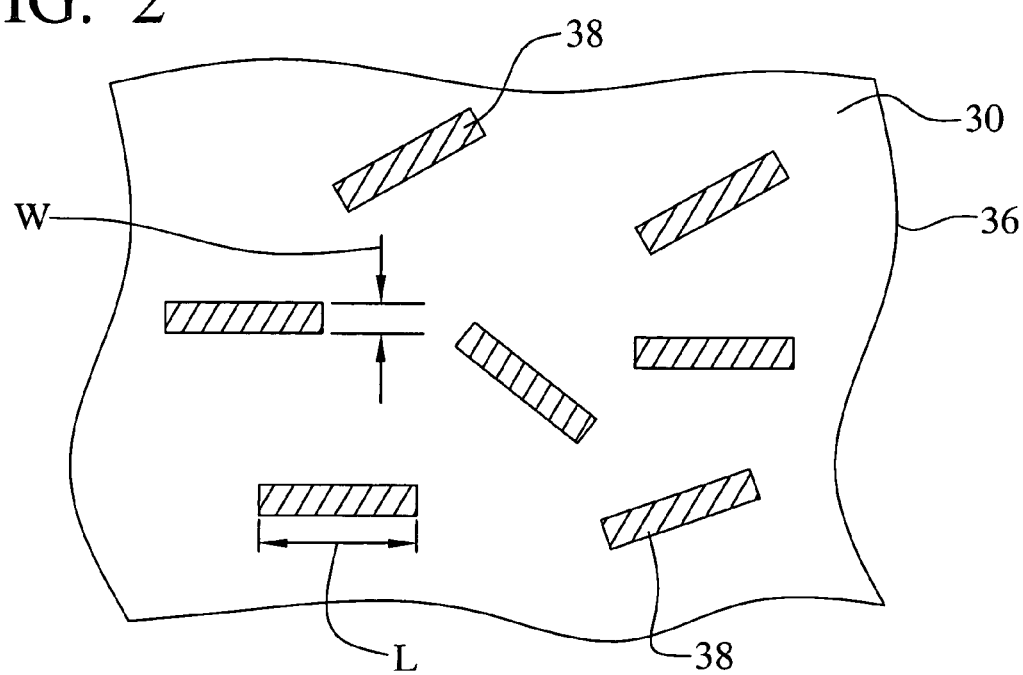
FIG. 3 illustrates a second preferred embodiment of a conductive loaded resin-based material wherein the conductive materials comprise micron conductive fibers.
Figure 4:
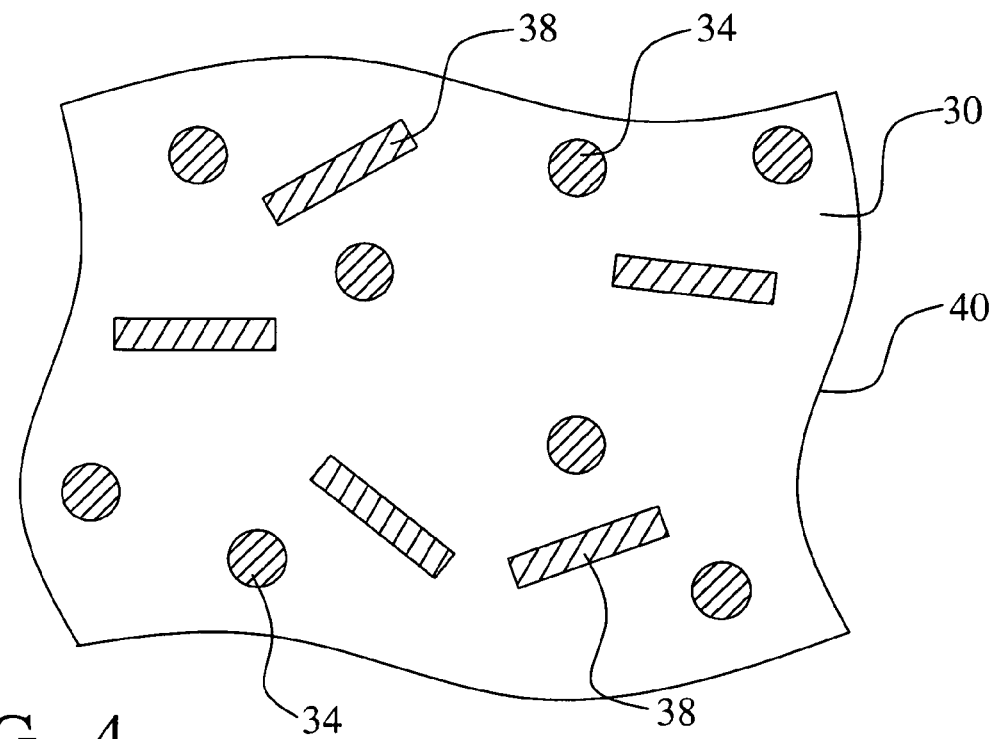
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8-11 micron in diameter and lengths of 4-6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
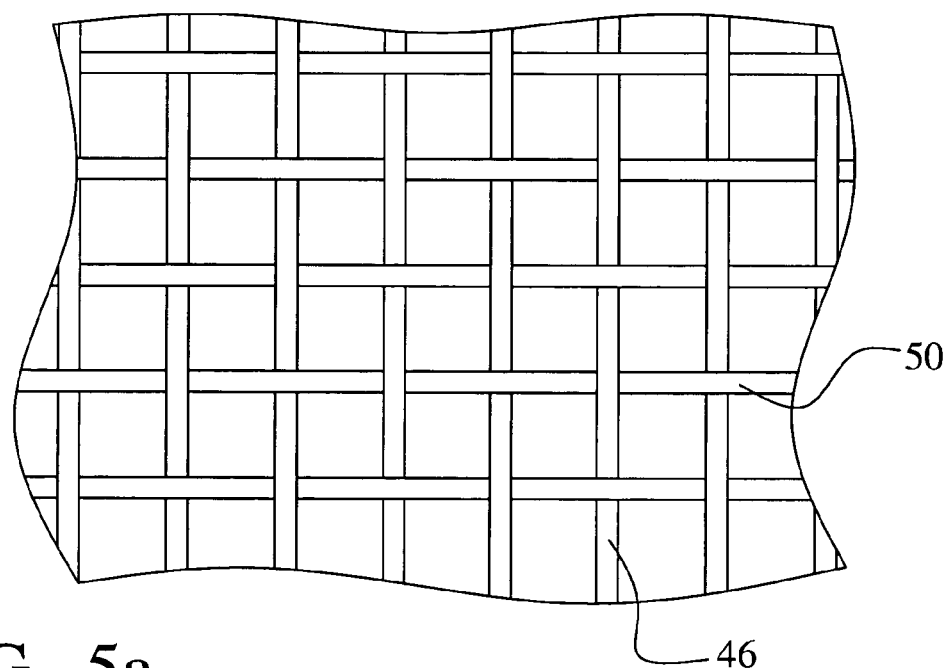
FIGS. 5a and 5b illustrate a fourth preferred embodiment wherein conductive fabric-like materials are formed from the conductive loaded resin-based material.
Figure 5B:
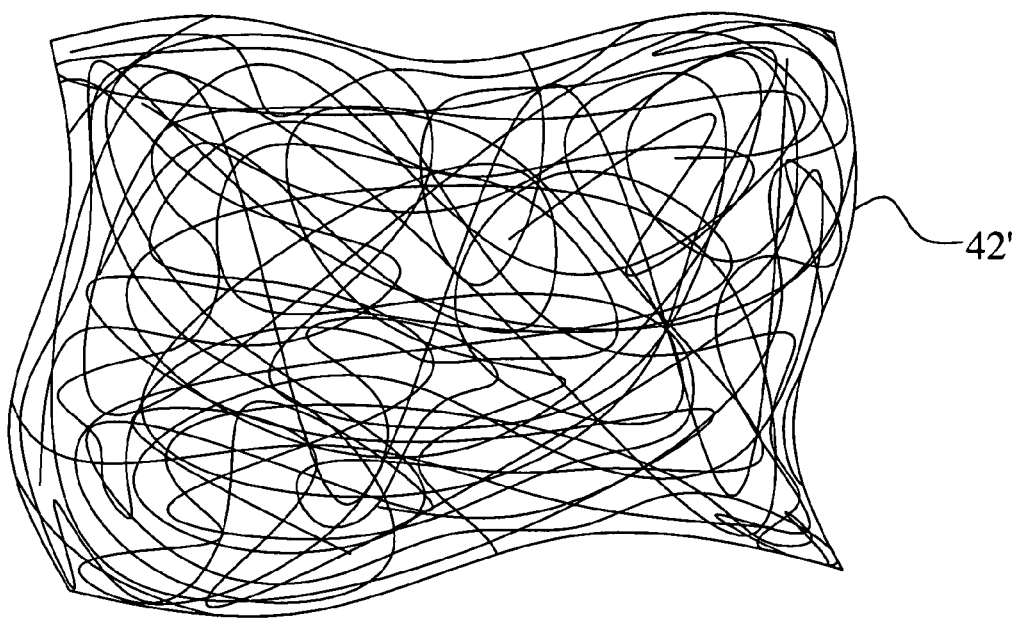

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figures 6A, 6B:
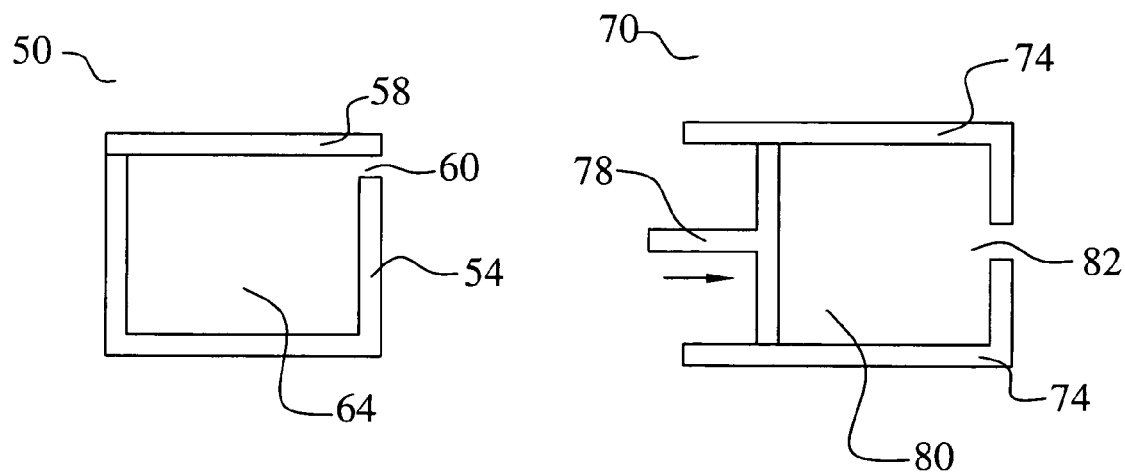
FIGS. 6a and 6b illustrate, in simplified schematic form, an injection molding apparatus and an extrusion molding apparatus that may be used to mold circuit conductors of a conductive loaded resin-based material.

Heating devices formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the heating devices are removed.

FIG. 6b shows a simplified schematic diagram of an extruder 70 for forming heating devices using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. Effective heating device are achieved. Methods to form heating devices are achieved. The heating device is molded of conductive loaded resin-based materials. Heating devices are molded of conductive loaded resin-based material where the heating device characteristics can be selected based on the doping of conductive materials in a resin-based material. Heating devices are molded of conductive loaded resin-based material where the heating device characteristics can be selected based on the characteristics of the selected resin-based material. Methods to fabricate heating devices from a conductive loaded resin-based material incorporate various forms of the material. A range of heating devices with heating elements of a conductive loaded resin-based material are realized.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A heating device comprising:
   a heating element comprising a conductive loaded, resin-based material comprising micron conductive fiber substantially homogenized in a base resin host wherein said micron conductive fiber has a diameter of between 3 μm and 12 μm and a length of between 2 mm and 14 mm;
   a first terminal connected at a first end of said heating element; and
   a second terminal connected at a second end of said heating element.

2. The device according to claim 1 wherein the ratio, by weight, of said micron conductive fiber to said resin host is between about 0.20 and about 0.40.

3. The device according to claim 1 wherein said conductive loaded resin-based material further comprises metal powder.

4. The device according to claim 3 wherein said metal powder is nickel, copper, or silver.

5. The device according to claim 3 wherein said metal powder is a non-conductive material with a metal plating.

6. The device according to claim 5 wherein said metal plating is nickel, copper, or silver.

7. The device according to claim 3 wherein said metal powder comprises a diameter of between about 3 μm and about 12 μm.

8. The device according to claim 1 wherein said conductive loaded resin-based material further comprises non-metal powder.

9. The device according to claim 8 wherein said non-metal powder is carbon, graphite, or an amine-based material.

10. The device according to claim 1 wherein said conductive loaded resin-based material further comprises a combination of metal powder and non-metal powder.

11. The device according to claim 1 wherein said micron conductive fiber comprises metal fiber.

12. The device according to claim 1 wherein said micron conductive fiber is nickel plated carbon fiber, stainless steel fiber, copper fiber, silver fiber or combinations thereof.

13. The device according to claim 1 wherein said micron conductive fiber comprises a nonconductive core and metal plating.

14. The device according to claim 1 further comprising an electrically insulating layer surrounding said heating element.

15. The device according to claim 14 wherein said electrically insulating layer is highly thermally conductive.

16. The device according to claim 14 wherein said electrically insulating layer is a resin-based material.

17. The device according to claim 14 wherein said heating element and said electrically insulating layer are flexible.

18. The device according to claim 14 further comprising a wire embedded in said electrically insulating layer.

19. The device according to claim 14 wherein said base resin and said electrically insulating layer comprise flame-retardant materials.

20. The device according to claim 1 further comprising a metal layer overlying said heating element.

21. The device according to claim 1 wherein said heating element comprises a planar pad.

22. The device according to claim 21 wherein said planar pad is a spiral pattern.

23. The device according to claim 1 wherein said heating device is embedded in a seating apparatus.

24. The device according to claim 1 wherein said heating device is laminated to a transparent panel.

25. The device according to claim 24 wherein said base resin is transparent.

26. The device according to claim 1 wherein said heating device is attached to a mirror.

27. The device according to claim 1 wherein said heating device is embedded in a flooring system.

28. The device according to claim 1 wherein said heating device is a cartridge.

29. The device according to claim 1 wherein said heating device further comprises a plurality of conductive fins.

30. The device according to claim 29 wherein said conductive fins comprise conductive loaded resin-based material.

31. The device according to claim 1 wherein said heating device is coupled around a pipe.

32. The device according to claim 1 wherein said heating device is a hollow pipe or tube capable of transporting a fluid.

33. The device according to claim 1 wherein said heating device is a circular rod.

34. The device according to claim 1 further comprising a wire embedded into said heating element.

35. A heating device comprising:
   a heating element comprising a conductive loaded, resin-based material comprising micron conductive fiber substantially homogenized in a base resin host wherein said micron conductive fiber is a metal fiber and wherein said micron conductive fiber has a diameter of between 3 μm and 12 μm and a length of between 2 mm and 14 mm;
   an electrically insulating layer surrounding said heating element;
   a first terminal connected at a first end of said heating element; and
   a second terminal connected at a second end of said heating element.

36. The device according to claim 35 wherein the ratio, by weight, of said micron conductive fiber to said resin host is between about 0.20 and about 0.40.

37. The device according to claim 35 wherein said conductive loaded resin-based material further comprises non-metal powder.

38. The device according to claim 37 wherein said non-metal powder is carbon, graphite, or an amine-based material.

39. The device according to claim 35 wherein said conductive loaded resin-based material further comprises metal powder.

40. The device according to claim 39 wherein said metal powder is nickel, copper, or silver.

41. The device according to claim 39 wherein said metal powder is a non-conductive material with a metal plating.

42. The device according to claim 41 wherein said metal plating is nickel, copper, or silver.

43. The device according to claim 35 wherein said micron conductive fiber comprises metal fiber.

44. The device according to claim 35 wherein said micron conductive fiber is nickel plated carbon fiber, stainless steel fiber, copper fiber, silver fiber or combinations thereof.

45. The device according to claim 35 wherein said micron conductive fiber comprises a nonconductive core and metal plating.

46. The device according to claim 35 wherein said electrically insulating layer is a resin-based material.

47. The device according to claim 35 wherein said heating element and said electrically insulating layer are flexible.

* * * * *